US010862625B2

(12) United States Patent
Yang et al.

(10) Patent No.: US 10,862,625 B2
(45) Date of Patent: Dec. 8, 2020

(54) POLARIZATION WEIGHT CALCULATION FOR PUNCTURED POLAR CODE

(71) Applicant: Qualcomm Incorporated, San Diego, CA (US)

(72) Inventors: Yang Yang, San Diego, CA (US); Jing Jiang, San Diego, CA (US); Changlong Xu, Beijing (CN); Gabi Sarkis, San Diego, CA (US); Chao Wei, Beijing (CN); Hari Sankar, San Diego, CA (US); Jian Li, Beijing (CN); Joseph Binamira Soriaga, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/476,890

(22) PCT Filed: Feb. 17, 2018

(86) PCT No.: PCT/CN2018/076924
§ 371 (c)(1),
(2) Date: Jul. 10, 2019

(87) PCT Pub. No.: WO2018/149416
PCT Pub. Date: Aug. 23, 2018

(65) Prior Publication Data
US 2019/0372712 A1    Dec. 5, 2019

(30) Foreign Application Priority Data
Feb. 20, 2017   (WO) ................ PCT/CN2017/074110

(51) Int. Cl.
*H04L 1/00*     (2006.01)
*H04L 1/16*     (2006.01)
(Continued)

(52) U.S. Cl.
CPC .......... *H04L 1/0057* (2013.01); *H04L 1/0068* (2013.01)

(58) Field of Classification Search
None
See application file for complete search history.

(56) References Cited

U.S. PATENT DOCUMENTS 7,461,328 B2 * 12/2008 Dabiri ................ H03M 13/1111
714/780
10,312,947 B2 * 6/2019 Ge ........................ H03M 13/13
(Continued)

FOREIGN PATENT DOCUMENTS

| CN | 106100794 A | 11/2016 |
| WO | WO 2015/149225 A1 | 10/2015 |
| WO | WO 2017/025823 A1 | 2/2017 |

OTHER PUBLICATIONS

International Search Report and Written Opinion—PCT/CN2017/074110—ISA/EPO—dated Nov. 16, 2017 (172875W01).
(Continued)

*Primary Examiner* — Phung M Chung
(74) *Attorney, Agent, or Firm* — Holland & Hart LLP

(57) ABSTRACT

Techniques are described for wireless communication. One method includes identifying a set of punctured bit locations in a received codeword. The received codeword is encoded using a polar code. The method also includes identifying a set of information bit locations of the polar code, with the set of information bit locations being determined based at least in part on polarization weights per polarized bit-channel of a polar code decoder that are a function of nulled repetition operations per polarization stage of the polar code identified based at least in part on the set of punctured bit locations. The method further includes processing the received codeword using the polar code decoder to obtain an information bit vector at the set of information bit locations.

24 Claims, 17 Drawing Sheets

(51) Int. Cl.
H04L 5/00 (2006.01)
H03M 13/00 (2006.01)

(56) References Cited

U.S. PATENT DOCUMENTS

| | | | |
|---|---|---|---|
| 10,432,357 B2 * | 10/2019 | Yang | H04L 1/0045 |
| 10,461,779 B2 * | 10/2019 | Hong | H04L 1/0067 |
| 10,623,138 B2 * | 4/2020 | Yang | H04L 1/0058 |
| 10,673,468 B2 * | 6/2020 | Ge | H03M 13/13 |
| 2015/0077277 A1 | 3/2015 | Alhussien et al. | |
| 2015/0236715 A1 | 8/2015 | Alhussien et al. | |
| 2016/0248547 A1 | 8/2016 | Shen et al. | |
| 2017/0047947 A1 | 2/2017 | Hong et al. | |

OTHER PUBLICATIONS

International Search Report and Written Opinion—PCT/CN2018/076924—ISA/EPO—dated May 2, 2018 (172875W02).

* cited by examiner

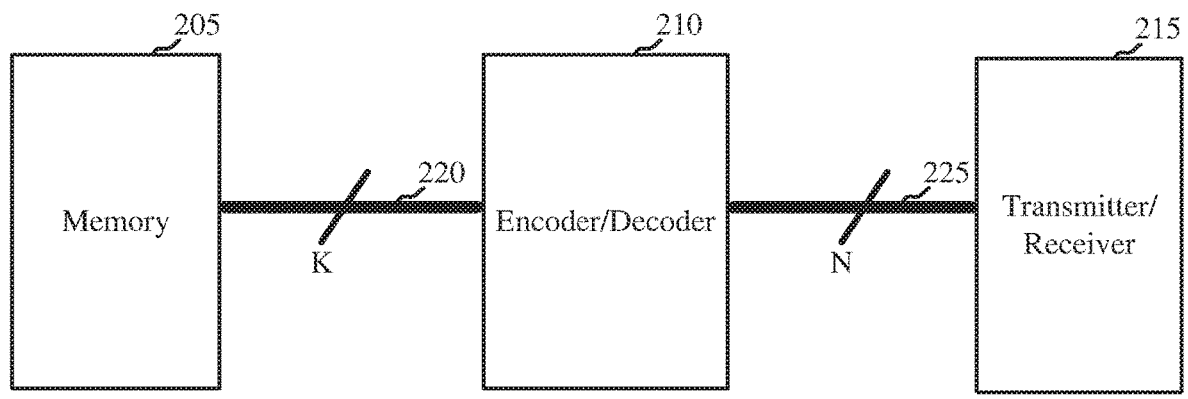
FIG. 2

Punctured Bit Location

POLARIZATION WEIGHT CALCULATION FOR PUNCTURED POLAR CODE

CROSS REFERENCES

The present application is a 371 national phase filing of International Application No. PCT/CN2018/076924 to Yang et al., entitled "POLARIZATION WEIGHT CALCULATION FOR PUNCTURED POLAR CODE", filed Feb. 17, 2018, which claims priority to International Patent Application No. PCT/CN2017/074110 to Yang et. al., entitled "POLARIZATION WEIGHT CALCULATION FOR PUNCTURED POLAR CODE", filed Feb. 20, 2017, each of which is assigned to the assignee hereof.

BACKGROUND

Field of the Disclosure

The present disclosure, for example, relates to wireless communication systems, and more particularly to the calculation of polarization weights for a punctured polar code.

Description of Related Art

Wireless communication systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems.

A wireless multiple-access communication system may include a number of base stations, each simultaneously supporting communication for multiple communication devices, otherwise known as user equipment (UEs). In a Long-Term Evolution (LTE) or LTE-Advanced (LTE-A) network, a set of one or more base stations may define an eNodeB (eNB). In a next generation, new radio (NR), 3GPP 5G, or millimeter wave (mmW) network, a base station may take the form of a smart radio head (RH) in combination with an access node controller (ANC), with a set of smart radio heads in communication with an ANC defining a gNodeB (gNB). A base station may communicate with a UE on downlink channels (e.g., for transmissions from the base station to the UE) and uplink channels (e.g., for transmissions from the UE to the base station).

Transmissions between wireless devices (e.g., base stations and UEs) may be encoded. In some cases, the encoding may include polar code encoding.

SUMMARY

In some cases, a codeword encoded using a polar code may be punctured. For example, to achieve a given code rate with an encoder having lengths determined by a power function (e.g., $2^N$), more bits may be generated from encoding than are transmitted for the given code rate. A punctured bit may be a bit for which no information is transmitted (e.g., the bit is skipped), or a bit that is used for another purpose (e.g., transmission of a reference signal, etc.). Puncturing may include, for example, shortening puncturing (or known bit puncturing), in which a set of most significant bits (MSBs) or later-generated bits of a codeword are punctured, and block puncturing (or unknown bit puncturing), in which a set of least significant bits (LSBs) or earlier-generated bits of a codeword are punctured. The present disclosure describes techniques for decoding a codeword that is encoded using a polar code and has a set of punctured bit locations.

In one example, a method of wireless communication is described. The method may include identifying a set of punctured bit locations in a received codeword. The received codeword may be encoded using a polar code. The method may also include identifying a set of information bit locations of the polar code, with the set of information bit locations being determined based at least in part on polarization weights per polarized bit-channel of a polar code decoder that are a function of nulled repetition operations per polarization stage of the polar code identified based at least in part on the set of punctured bit locations. The method may further include processing the received codeword using the polar code decoder to obtain an information bit vector at the set of information bit locations.

In one example, an apparatus for wireless communication is described. The apparatus may include means for identifying a set of punctured bit locations in a received codeword. The received codeword may be encoded using a polar code. The apparatus may also include means for identifying a set of information bit locations of the polar code, with the set of information bit locations being determined based at least in part on polarization weights per polarized bit-channel of a polar code decoder that are a function of nulled repetition operations per polarization stage of the polar code identified based at least in part on the set of punctured bit locations. The apparatus may further include means for processing the received codeword using the polar code decoder to obtain an information bit vector at the set of information bit locations.

In one example, another apparatus for wireless communication is described. The apparatus may include a processor, memory in electronic communication with the processor, and instructions stored in the memory. The instructions may be executable by the processor to identify a set of punctured bit locations in a received codeword. The received codeword may be encoded using a polar code. The instructions may also be executable by the processor to identify a set of information bit locations of the polar code, with the set of information bit locations being determined based at least in part on polarization weights per polarized bit-channel of a polar code decoder that are a function of nulled repetition operations per polarization stage of the polar code identified based at least in part on the set of punctured bit locations. The instructions may be further executable to process the received codeword using the polar code decoder to obtain an information bit vector at the set of information bit locations.

In one example, a non-transitory computer-readable medium storing computer-executable code for wireless communication is described. The code may be executable by a processor to identify a set of punctured bit locations in a received codeword. The received codeword may be encoded using a polar code. The code may also be executable by the processor to identify a set of information bit locations of the polar code, with the set of information bit locations being determined based at least in part on polarization weights per polarized bit-channel of a polar code decoder that are a function of nulled repetition operations per polarization stage of the polar code identified based at least in part on the set of punctured bit locations. The code may be further executable by the processor to process the received codeword using the polar code decoder to obtain an information bit vector at the set of information bit locations.

In some examples of the method, apparatus, or non-transitory computer-readable medium described above, the identifying the set of information bit locations may include determining, based at least in part on the set of punctured bit locations, respective numbers of the nulled repetition operations per polarization stage of the polar code; determining, based at least in part on the respective numbers of the nulled repetition operations per polarization stage, the polarization weights per polarized bit-channel of the polar code decoder, and determining the set of information bit locations based at least in part on a ranking of the polarization weights per polarized bit-channel of the polar code decoder.

In some examples of the method, apparatus, or non-transitory computer-readable medium described above, the determining the polarization weights per polarized bit-channel may include identifying, for each polarization stage having one or more nulled repetition operations, a polarization weight factor based at least in part on a total number of repetition operations for the each polarization stage and a respective number of the nulled repetition operations for the each polarization stage; and generating a polarization weight for each polarized bit-channel of the polarized bit-channels by combining a set of polarization stage weights associated with each active repetition operation of the each polarized bit-channel of the polarized bit-channels, wherein each polarization stage weight of the set of polarization stage weights is based at least in part on the polarization weight factor for a corresponding polarization stage.

In some examples of the method, apparatus, or non-transitory computer-readable medium described above, the polarization weight factor for a polarization stage may be based at least in part on a ratio of active repetition operations in the polarization stage to the total number of repetition operations in the polarization stage.

In some examples of the method, apparatus, or non-transitory computer-readable medium described above, the set of polarization stage weights may be determined by the polarization stage weight associated with the each active repetition operation scaled by the polarization weight factor for the corresponding polarization stage of the each active repetition operation.

In some examples of the method, apparatus, or non-transitory computer-readable medium described above, the polar code decoder may be a natural bit order polar code decoder or a bit-reversed order polar code decoder.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 2 illustrates an example of a device for channel encoding and decoding, in accordance with various aspects of the present disclosure;

DETAILED DESCRIPTION

Techniques are described for calculating polarization weights for a punctured polar code. The calculated polarization weights may be used to identify a set of information bit locations of the polar code. In some examples, the polarization weights may be calculated in accordance with a polarization weight method for ranking polarized bit locations of a polar code. The polarization weights may then be scaled based on a number of repetition operations (e.g., G operations), per polarization stage of the polar code, that are determined to be nulled. A repetition operation may be determined to be nulled because it is affected by the puncturing of the polar code and produces an output log-likelihood ratio (LLR) that provides no further information about the identity of a bit. For example, a nulled LLR does not indicate whether a bit is more likely or less likely to be a logic 1 or a logic 0.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Aspects of the disclosure are initially described in the context of a wireless communication system. Aspects of the disclosure are further illustrated by and described with reference to apparatus diagrams, system diagrams, and flowcharts that relate to polarization weight calculation for punctured polar codes.

Figure 1:
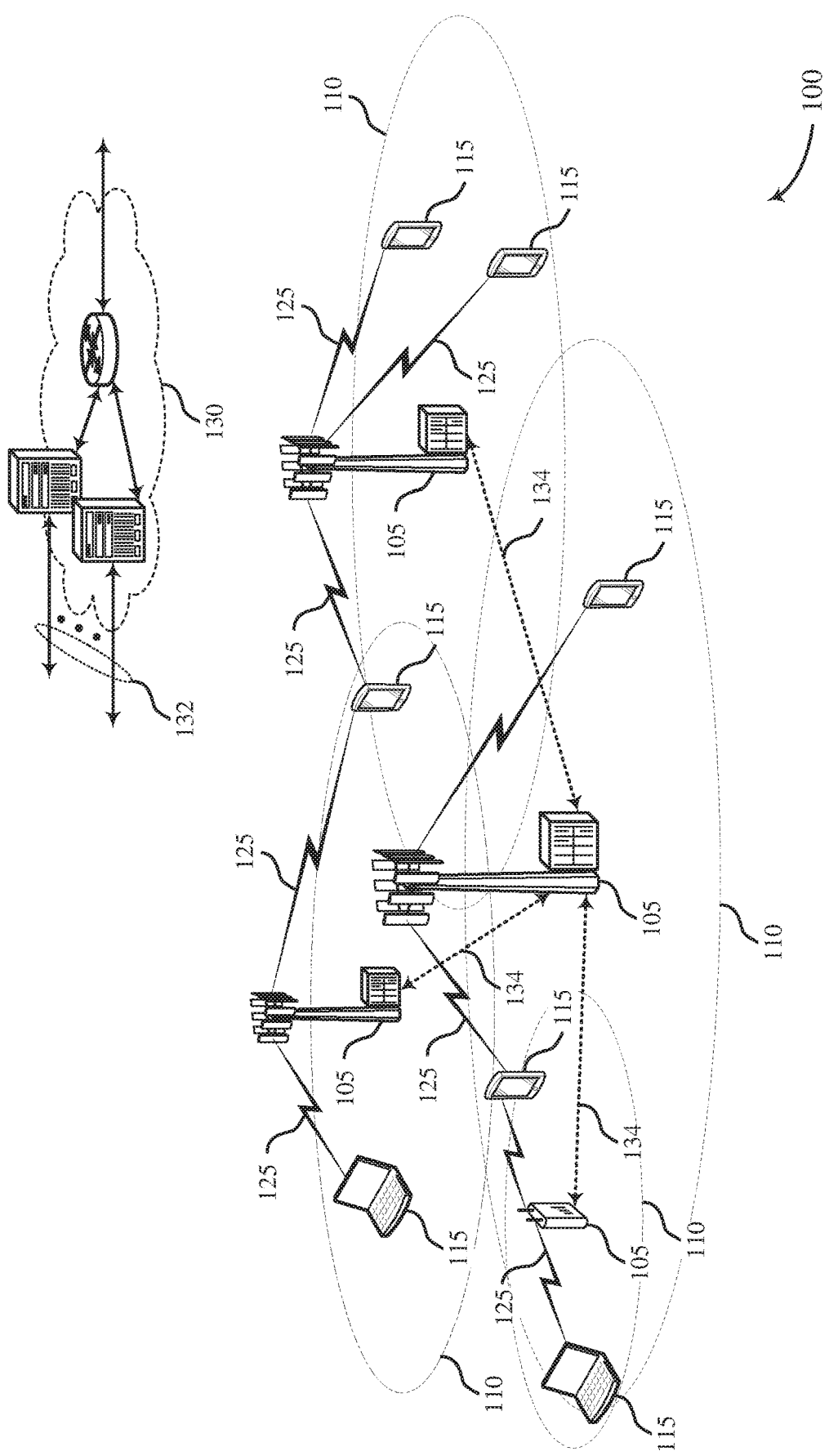
FIG. 1 illustrates an example of a wireless communication system, in accordance with various aspects of the present disclosure.

FIG. 1 illustrates an example of a wireless communication system 100, in accordance with various aspects of the present disclosure. The wireless communication system 100 includes base stations 105, UEs 115, and a core network 130. In some examples, the wireless communication system 100 may be an LTE (or LTE-Advanced) network, or an NR network. In some cases, the wireless communication system 100 may support enhanced broadband communications, ultra-reliable (i.e., mission critical) communications, low latency communications, and communications with low-cost and low-complexity devices.

The base stations 105 may wirelessly communicate with UEs 115 via one or more base station antennas. Each base station 105 may provide communication coverage for a respective geographic coverage area 110. The communication links 125 shown in wireless communication system 100 may include uplinks, from a UE 115 to a base station 105, or downlinks, from a base station 105 to a UE 115. Control information and data may be multiplexed on an uplink channel or downlink channel according to various techniques. Control information and data may be multiplexed on a downlink channel, for example, using time division multiplexing (TDM) techniques, frequency division multiplexing (FDM) techniques, or hybrid TDM-FDM techniques.

The UEs 115 may be dispersed throughout the wireless communication system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communication device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communication system may be configured to provide ultra-reliable communications for these functions.

The base stations 105 may communicate with the core network 130 and with one another. For example, base stations 105 may interface with the core network 130 through backhaul links 132 (e.g., SI, etc.). The base stations 105 may communicate with one another over backhaul links 134 (e.g., X2, etc.) either directly or indirectly (e.g., through core network 130). The base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as eNodeBs (eNBs) 105.

A base station 105 may be connected by an SI interface to the core network 130. The core network 130 may be an evolved packet core (EPC), which may include at least one mobility management entity (MME), at least one serving gateway (S-GW), and at least one Packet Data Network (PDN) Gateway (P-GW). The MME may be the control node that processes the signaling between the UE 115 and the EPC. All user internet protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched Streaming Service (PSS).

The wireless communication system 100 may operate in an ultra high frequency (UHF) frequency region using frequency bands from 700 MHz to 2600 MHz (2.6 GHz), although in some cases WLAN networks may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communication system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, the wireless communication system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 115) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Multiple-input multiple-output (MIMO) wireless communication systems use a transmission scheme between a transmitter (e.g., a base station 105) and a receiver (e.g., a UE 115), where both transmitter and receiver are equipped with multiple antennas. Some portions of wireless communication system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, the wireless communication system 100 may be a packet-based network that operates according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARQ) to provide retransmission at the MAC layer to improve link efficiency. In the control plane, the Radio Resource Control (RRC) protocol layer may provide establishment, configuration, and maintenance of an RRC connection between a UE 115 and a core network 130 supporting radio bearers for user plane data. At the Physical (PHY) layer, transport channels may be mapped to physical channels.

Time intervals in LTE or NR may be expressed in multiples of a basic time unit (which may be a sampling period of $T_s=1/30,720,000$ seconds). Time resources may be organized according to radio frames of length of 10 ms ($T_f=307200T_s$), which may be identified by a system frame number (SFN) ranging from 0 to 1023. Each frame may include ten 1 ms subframes numbered from 0 to 9. A subframe may be further divided into two 0.5 ms slots, each of which contains 6 or 7 modulation symbol periods (depending on the length of the cyclic prefix prepended to each symbol). Excluding the cyclic prefix, each symbol contains 2048 sample periods. In some cases the subframe may be the smallest scheduling unit, also known as a TTI. In other cases, a TTI may be shorter than a subframe or may be dynamically selected (e.g., in short TTI bursts or in selected component carriers using short TTIs).

A resource element may consist of one symbol period and one subcarrier (e.g., a 15 KHz frequency range). A resource block may contain 12 consecutive subcarriers in the frequency domain and, for a normal cyclic prefix in each OFDM symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be.

In some cases, the wireless communication system 100 may utilize enhanced component carriers (eCCs). An eCC may be characterized by one or more features including: wider bandwidth, shorter symbol duration, shorter TTIs, and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 15 that are not capable of monitoring the whole bandwidth or prefer to use a limited bandwidth (e.g., to conserve power).

In some cases, an eCC may utilize a different symbol duration than other CCs, which may include use of a reduced symbol duration as compared with symbol durations of the other CCs. A shorter symbol duration may be associated with increased subcarrier spacing. A TTI in an eCC may consist of one or multiple symbols. In some cases, the TTI duration (that is, the number of symbols in a TTI) may be variable. A device, such as a UE 115 or base station 105, utilizing eCCs may transmit wideband signals (e.g., 20, 40, 60, 80 Mhz, etc.) at reduced symbol durations (e.g., 16.67 microseconds).

In some cases, the wireless communication system 100 may utilize both licensed and unlicensed radio frequency spectrum bands. For example, the wireless communication system 100 may employ LTE License Assisted Access (LTE-LAA) or LTE Unlicensed (LTE U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based at least in part on a CA configuration in conjunction with CCs operating in a licensed band. Operations in unlicensed spectrum may include downlink transmissions, uplink transmissions, or both. Duplexing in unlicensed spectrum may be based at least in part on frequency division duplexing (FDD), time division duplexing (TDD) or a combination of both.

In some examples, one or more of the base stations 105 or UEs 115 may transmit and/or receive codewords that are encoded/decoded using a polar code.

FIG. 2 illustrates an example of a device 200 for channel encoding and decoding, in accordance with various aspects of the present disclosure. The device 200 may be an example of aspects of any wireless device that performs an encoding or decoding operation (e.g., any wireless device operating within the wireless communication system 100). In some examples, the device 200 may be an example of aspects of a UE 115 or base station 105 described with reference to FIG. 1.

As shown, the device 200 may include a memory 205, an encoder/decoder 210, and a transmitter/receiver 215. The bus 220 may connect the memory 205 to the encoder/decoder 210. The bus 225 may also connect the encoder/decoder 210 to the transmitter/receiver 215. In some instances, the device 200 may have data stored in the memory 205, which data is to be transmitted to another device, such as a UE 115 or a base station 105. To initiate the transmission process, the device 200 may retrieve (e.g., from the memory 205) the data for transmission. The data may include a number of information bits provided from the memory 205 to the encoder/decoder 210 via the bus 220. The number of information bits may be represented as a value 'K,' as shown. The encoder/decoder 210 may encode the number of information bits and output a codeword having a length N which may be different than or the same as K. The bits that are not allocated as information bits (i.e., N-K bits) may be parity bits or frozen bits. Parity bits may be used in parity check (PC) polar coding techniques and frozen bits may be bits of a given value (0, 1, etc.) known to both the encoder and the decoder. From a receiving device perspective, the device 200 may receive encoded data (e.g., a codeword) via the transmitter/receiver 215 and decode the encoded data using the encoder/decoder 210 to obtain the transmitted information bits.

In some examples, the method for encoding data transmissions by the encoder/decoder 210 may involve generating a polar code of length N and dimension 'K' (corresponding to the number of information bits). A polar code is an example of a linear block error correcting code and is the first coding technique to provably achieve Shannon (e.g., maximum) channel capacity. The encoder portion of the encoder/decoder 210 may include multiple polarized bit-channels (e.g., multiple channel instances or encoding branches) that are each loaded with a bit to be encoded. Bits to be encoded may include information bits and non-information bits. Reliability metrics may be calculated based at least in part on bit locations of the encoder/decoder 210. For example, the probability that a bit loaded into a given bit location of an encoder operated at a transmitting device will be successfully decoded and output at a given bit location of a decoder operated at a receiving device may be calculated. This probability may be referred to as a reliability metric and may be associated with the given bit location. In some cases, the bit locations may be ranked (sorted) based at least in part on the determined reliability metrics (e.g., in order of decreasing or increasing reliability) and all or a portion of the bit locations may be assigned a given bit type (e.g., parity bit, information bit, frozen bit, etc.). For a given dimension K, the K most reliable bit locations may be assigned to information bits, and the remaining bits may be assigned to frozen bits or parity bits.

The encoder/decoder 210 may use a number of encoding techniques to encode the data for transmission such as linear block encoding, polar code encoding, PC polar code encoding, Reed-Muller (RM) encoding, polar code RM encoding, and the like, which may introduce redundancy into the encoded output. This redundancy may increase the overall probability that the number of information bits will be successfully decoded upon reception.

Figure 3:
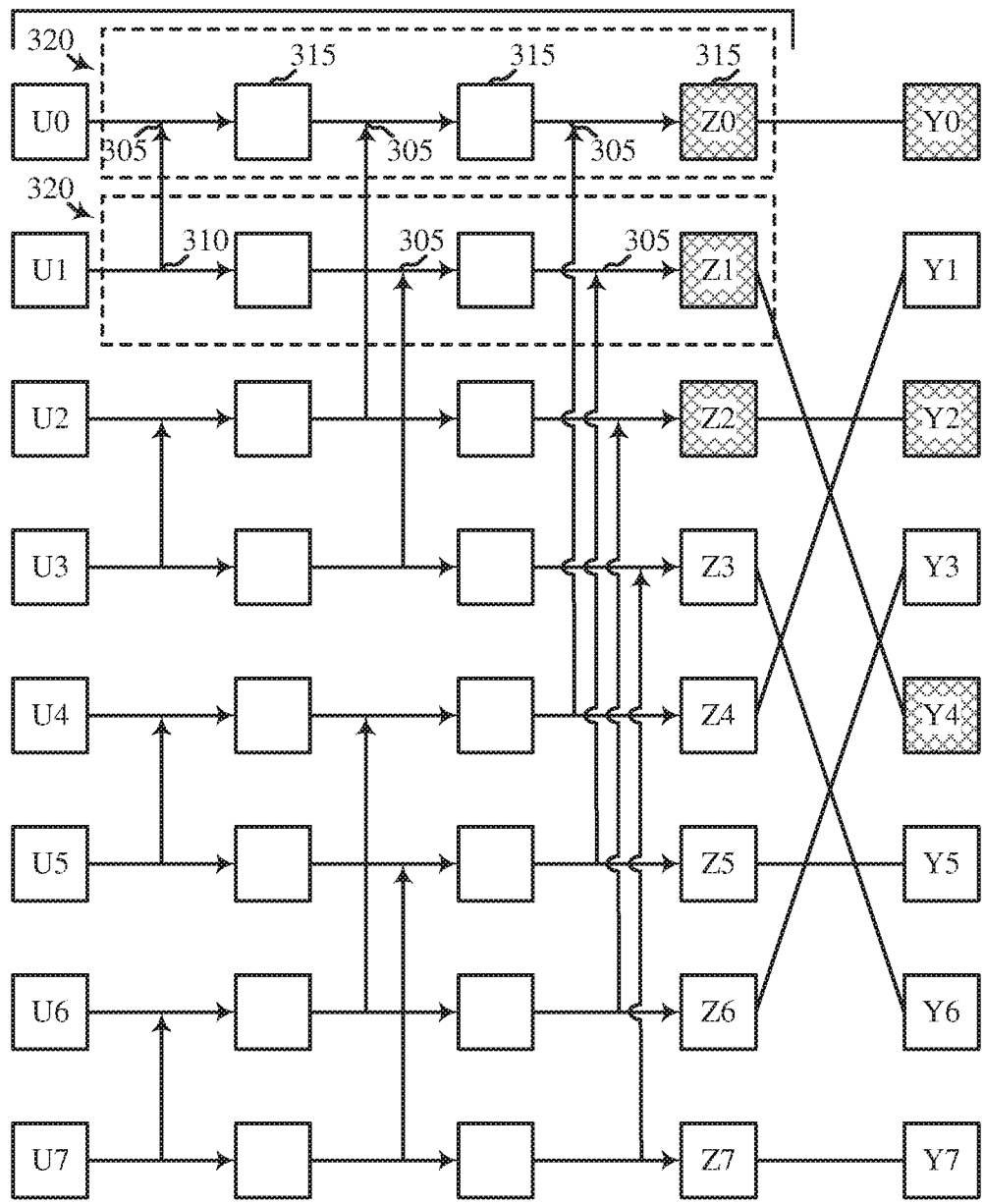
FIG. 3 shows an example of a natural order polar code encoder, in accordance with various aspects of the present disclosure.

FIG. 3 shows an example diagram of a polar code encoder 300, in accordance with various aspects of the present disclosure. The polar code encoder 300 may be included in a transmitter, such as a transmitter included in one of the UEs 115 or base stations 105 described with reference to FIG. 1. The polar code encoder 300 may be an example of aspects of the encoder/decoder 210 described with reference to FIG. 2.

The encoder 300 may receive an input vector, U, including a set of bits (e.g., U0, U1, U2, U3, U4, U5, U6, and U7) including information bits, frozen bits, and/or parity bits. The set of bits may be encoded in a codeword Z using a polar code encoding algorithm implemented by the encoder 300. The polar code encoding algorithm may be implemented by a plurality of operations, including, for example, exclusive OR (XOR) operations 305 performed where the upper ends of vertical arrow segments intersect horizontal arrow segments, and repetition operations 310 performed where the lower ends of vertical arrow segments intersect horizontal arrow segments. Each XOR operation 305 or repetition operation 310 may generate an output 315. The XOR operations 305 and repetition operations 310 may be performed on a number of interconnected bit-channels 320, that generate a codeword Z. The codeword Z includes a set of bits (e.g., Z0, Z1, Z2, Z3, Z4, Z5, Z6, and Z7) that may be transmitted over a physical channel. Codeword Y illustrates the effect of bit-reversal of the polar encoder 300. Codeword Y includes bits Y0, Y1, Y2, Y3, Y4, Y5, Y6, and Y7. The bits of the codeword Y may be in a bit-reversed order compared to the bits of the codeword Z. The transmitter may transmit codeword Z (non-bit-reversed) or codeword Y (bit-reversed).

In some cases, the codewords Y or Z may be punctured in accordance with non-shortening puncturing before transmission. Block puncturing (or unknown bit puncturing) is one form of non-shortening puncturing, and involves skipping transmission of a set of LSBs of the codeword Z. The set of LSBs that are block punctured are bits of the codeword Z that are dependent on the computation of other bits of the codeword Z. Another form of non-shortening puncture may include puncturing a non-contiguous set of bits of the codeword Z. In contrast to a non-shortening puncture, a shortening puncture (or known bit puncturing) of the codeword Z may include 1) a zeroing of a set of MSBs of the codeword Z and corresponding locations in U with the same indices, or 2) a zeroing of a set of MSBs of the codeword Y and corresponding locations in U with the indices that are bit-reversed compared to the bit locations zeroed in codeword Y. In some examples, zeroing may be equivalent to any known bit value (e.g., a logic 0 or a logic 1)

As shown in FIG. 3, the block puncture of a set of 3 LSBs of codeword Z results in a puncture of a non-contiguous set of bits in codeword Y, which set of bits in codeword Y includes bits that are in a bit-reversed order compared to the bits of codeword Z. The schemes described in the present disclosure may be applied in the context of a block puncture (as shown in FIG. 3), or in the context of other non-shortening punctures (e.g., in the context of a non-shortening puncture that punctures a non-contiguous set of bits in codeword Z).

Figure 4:
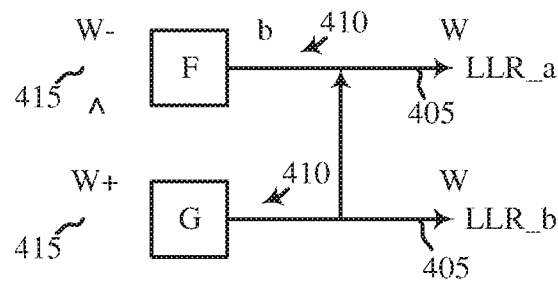
FIGS. 4-6 show examples of polar code decoders, in accordance with various aspects of the present disclosure.

FIG. 4 shows an example of a polar code decoder 400, in accordance with various aspects of the present disclosure. The polar code decoder 400 may be included in a receiver, such as a receiver included in one of the UEs 115 or base stations 105 described with reference to FIG. 1. The polar code decoder 400 may be an example of aspects of the encoder/decoder 210 described with reference to FIG. 2. By way of example, the polar code decoder 400 is a 2-bit decoder.

The decoder 400 may receive a plurality of LLRs associated with a plurality of bits of a received codeword (e.g., a 2-bit codeword). The bits of the received codeword may be encoded using a polar code. The plurality of LLRs may be received at a plurality of unpolarized bit locations 405 of a plurality of interconnected bit-channels 410 of the decoder 400. The plurality of LLRs may be transformed into an output vector, at a plurality of polarized bit locations 415 of the bit-channels 410, by a plurality of operations performed on the bit-channels 410. The operations may include a number of single parity check (SPC) operations (e.g., F operations) and a number of repetition operations (e.g., G operations). The blocks labeled F and G represent the outputs of such operations, with each F operation being performed where the upper end of a vertical arrow segment intersects a horizontal arrow segment, and with each G operation being performed where the lower end of a vertical arrow segment intersects a horizontal arrow segment.

By way of example, the decoder 400 is shown to perform one F operation and one G operation in a single polarization stage (i.e., a Stage 0, or sometimes referred to as Layer 0). Each F operation may receive an operand LLR_a (associated with a less significant bit position or XOR'd bit position) and an operand LLR_b (associated with a more significant bit position or non-XOR'd bit position) and perform the polar code LLR operation:

$$F(LLR\_a, LLR\_b) = \text{Sign}(LLR\_a) \times \text{Sign}(LLR\_b) \times \min(|LLR\_a|, |LLR\_b|)$$

Each G operation may receive an operand LLR_a and an operand LLR_b and perform the polar code LLR operation:

$$G(LLR\_a, LLR\_b) = LLR\_b + LLR\_a \text{ if } b = 0$$

$$= LLR\_b - LLR\_a \text{ if } b = 1$$

where the b which may be 0 or 1 is indicated in FIG. 4.

Because of the construction of the decoder 400 (e.g., a successive cancellation construction), each of the bit-channels 410 may be associated with a same capacity at the unpolarized bit locations 405, and with a different capacity at the polarized bit locations 415. Thus, the bit-channels 410 may not be ranked based on their respective capacities at the unpolarized bit locations 405, and may be assigned equal weights W based on their capacities at the unpolarized bit locations 405, but may be ranked based on their respective capacities at the polarized bit locations 405, and may be assigned respective weights W+ and W− based on their capacities at the polarized bit locations 415 (e.g., with W+ being the highest weight). The capacity or weight of a bit-channel (or bit location) may indicate the error probability associated with a bit at the bit location. Thus, the error probability associated with each of the unpolarized bit locations 405 may be the same, but the error probabilities associated with the polarized bit locations 415 differ. In the 2-bit decoder example shown in FIG. 4, one of the polarized bit locations 415 is associated with a bit-channel 410 having a weight of W+ and a lower error probability, and the other polarized bit location 415 is associated with a bit-channel 410 having a weight of W− and a higher error probability. Typically, an information bit would be transmitted/received on a bit-channel, and at a polarized bit location 415, associated with a highest weight; and a frozen bit would typically be transmitted/received on a bit-channel, and at a polarized bit location 415, associated with a lowest weight.

In general, the following relationships between the unpolarized bit locations 405 and polarized bit locations 415 apply:

$$\text{Capacity}(W+) > \text{Capacity}(W-)$$

$$\text{Capacity}(W+) + \text{Capacity}(W-) = 2 \times \text{Capacity}(W)$$

Figure 5:
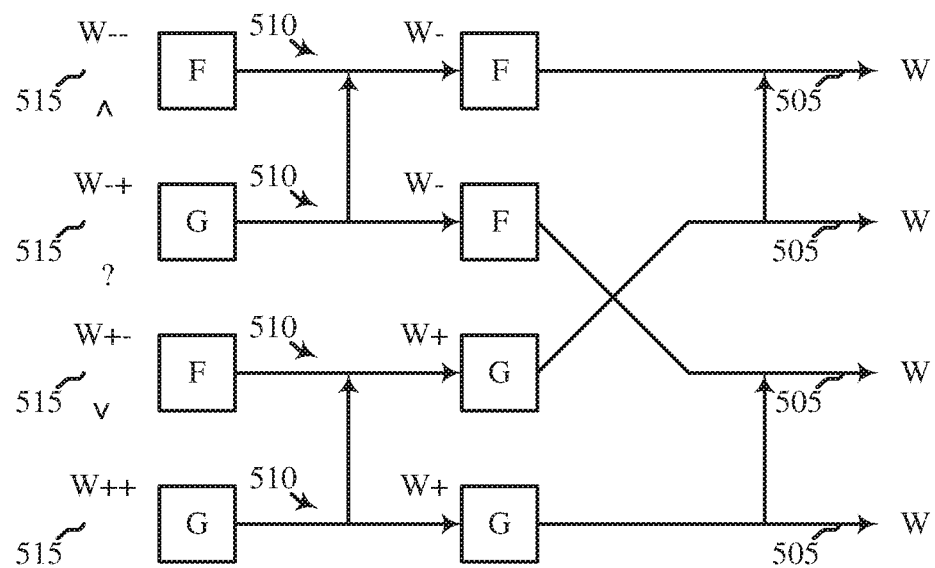

FIG. 5 shows an example of a polar code decoder 500, in accordance with various aspects of the present disclosure. The polar code decoder 500 may be included in a receiver, such as a receiver included in one of the UEs 115 or base stations 105 described with reference to FIG. 1. The polar code decoder 500 may be an example of aspects of the encoder/decoder 210 described with reference to FIG. 2. By way of example, the polar code decoder 500 is a 4-bit decoder.

The decoder 500 may receive a plurality of LLRs associated with a plurality of bits of a received codeword (e.g., a 4-bit codeword), similarly to the decoder 400. The bits of the received codeword may be encoded using a polar code. The plurality of LLRs may be received at a plurality of unpolarized bit locations 505 of a plurality of interconnected bit-channels 510 of the decoder 500. The plurality of LLRs may be transformed into an output vector, at a plurality of polarized bit locations 515 of the bit-channels 510, by a plurality of operations performed on the bit-channels 510. The operations may include a number of SPC operations (e.g., F operations) and a number of repetition operations or nulled repetition operations (e.g., G operations). The blocks labeled F and G represent the outputs of such operations, with each F operation being performed where the upper end of a vertical arrow segment intersects a horizontal arrow segment, and with each G operation being performed where the lower end of a vertical arrow segment intersects a horizontal arrow segment. By way of example, the decoder 500 is shown to perform four F operations and four G operations, distributed amongst two polarization stages (i.e., a Stage 0 and a Stage 1). Each F operation and G operation may be implemented as described with reference to FIG. 4.

Because of the construction of the decoder 500 (i.e., a successive cancellation construction), each of the bit-channels 510 may be associated with a same capacity at the unpolarized bit locations 505, and with a different capacity at the polarized bit locations 515. In the 4-bit decoder example shown in FIG. 5, a first two bit-channels 510 may be identified as lower capacity and assigned a lower weight (W−) after performing Stage 1 operations, and a second two bit-channels 510 may be identified as higher capacity and assigned a higher weight (W+) after performing Stage 1 operations. After performing Stage 0 operations, one of the bit-channels 510 may be identified as a lowest capacity bit-channel 510 and assigned a lowest weight (W−), and one bit-channel 510 may be identified as a highest capacity bit-channel 510 and assigned a highest weight (W++).

However, it is unknown which of the two remaining bit-channels 510 has the highest capacity (e.g., the weights W+− and W−+ may be arbitrary with respect to one another and cannot be deterministically ranked). In order to determine the locations of all information bits, frozen bits, and parity bits (if any), all of the polarized bit locations 515 may need to be ranked with respect to all other polarized bit locations 515.

Figure 6:
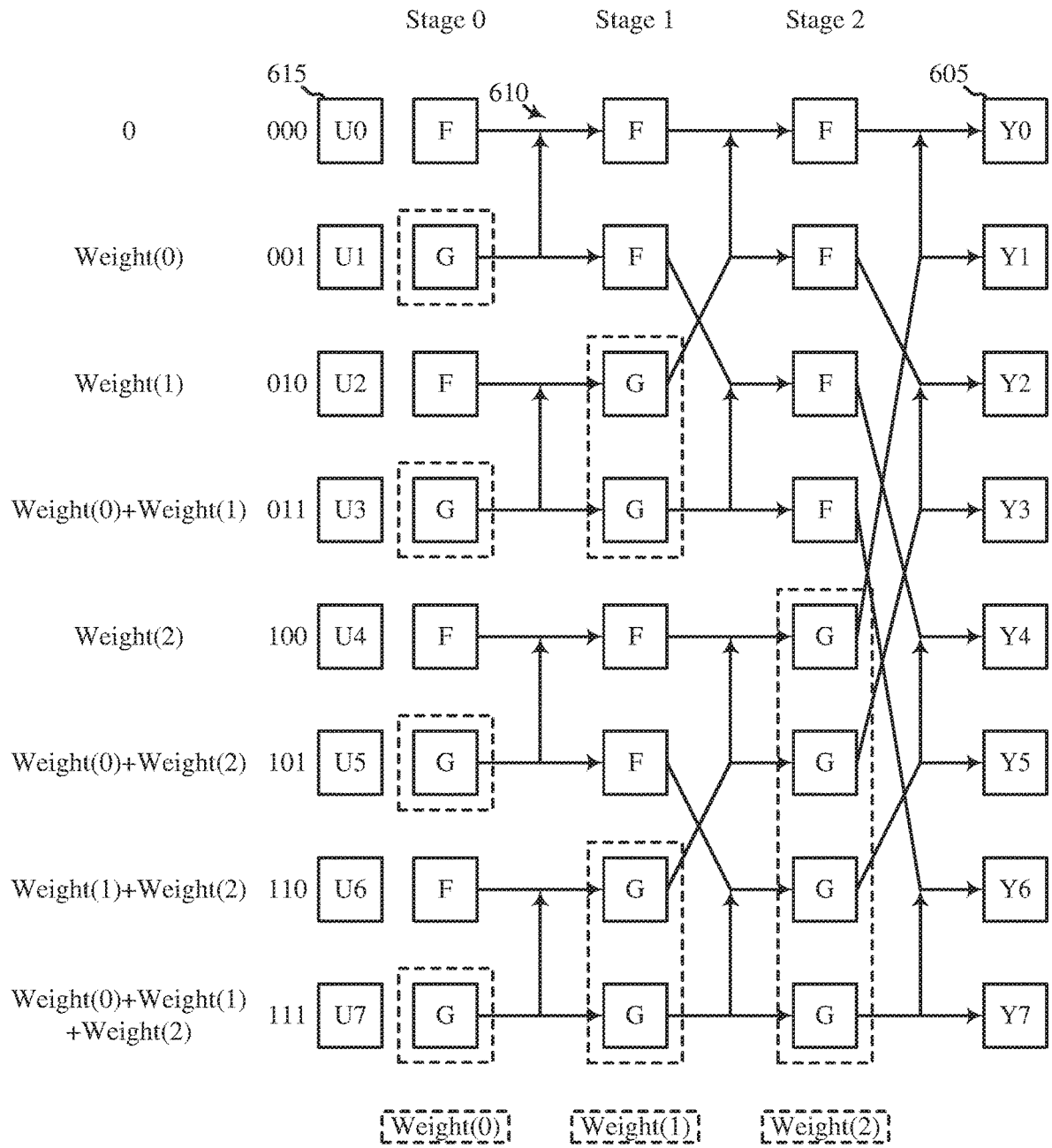

FIG. 6 shows an example of a polar code decoder 600, in accordance with various aspects of the present disclosure. The polar code decoder 600 may be included in a receiver, such as a receiver included in one of the UEs 115 or base stations 105 described with reference to FIG. 1. The polar code decoder 600 may be an example of aspects of the encoder/decoder 210 described with reference to FIG. 2. By way of example, the polar code decoder 600 is an 8-bit decoder.

The decoder 600 may receive a plurality of LLRs associated with a plurality of bits of a received codeword (e.g., an 8-bit codeword Y), similarly to the decoders 400 and 500. The bits of the received codeword may be encoded using a polar code. The plurality of LLRs may be received at a plurality of unpolarized bit locations 605 of a plurality of interconnected bit-channels 610 of the decoder 600. The plurality of LLRs may be transformed into an output vector, U, at a plurality of polarized bit locations 615 of the bit-channels 610, by a plurality of operations performed on the bit-channels 610. The operations may include a number of SPC operations (e.g., F operations) and a number of repetition operations (e.g., G operations). The blocks labeled F and G represent the outputs of such operations, with each F operation being performed where the upper end of a vertical arrow segment intersects a horizontal arrow segment, and with each G operation being performed where the lower end of a vertical arrow segment intersects a horizontal arrow segment. By way of example, the decoder 600 is shown to perform twelve F operations and twelve G operations, distributed amongst three polarization stages (i.e., a Stage 0, a Stage 1, and a Stage 2). Each F operation and G operation may be implemented as described with reference to FIG. 4.

Because of the construction of the decoder 600 (i.e., a successive cancellation construction), each of the bit-channels 610 may be associated with a same capacity at the unpolarized bit locations 605, and with a different capacity at the polarized bit locations 615. Because all polarized bit locations 615 may need to be ranked with respect to all other polarized bit locations 615 to determine the locations of all information bits, frozen bits, and parity bits (if any) at the polarized bit locations 615, and because the operation of the decoder 600 alone may not be sufficient to rank all of the polarized bit locations 615 with respect to all other polarized bit locations 615, the polarized bit locations 615 may be ranked using a polarization weight method.

In accordance with the polarization weight method, a polarization weight, $W_i$, of a bit-channel i 610 associated with a polarized bit location, $U_i$, may be defined as:

$$W_i = \sum_{j=0}^{m-1} B_j \times \text{weight}(j)$$

where i is a bit-channel index, binary($B_{m-1}B_{m-2} \ldots B_0$) is the binary representation of i, j is a stage index (or stage_id or layer_id), m is the total number of stages in a polar code (or in the decoder 600) which is the log 2 of the block size, $B_j$ is the $j^{th}$ bit from the LSB, and weight(j) is a polarization stage weight (sometimes referred to as a polarization layer weight) associated with stage j. The value of weight(j) may be determined as:

$$\text{weight}(j) = 2^{\frac{j}{4}}$$

For the decoder 600, the binary bit-channel index i may be expressed as binary($B_2B_1B_0$). A bit-channel includes a G operation in each stage j of a bit-channel for which $B_j=1$. Thus, the quantity $B_j \times \text{weight}(j)$ evaluates to 0 for each stage j of a bit-channel that includes an F operation, and to weight(j) for each stage j of a bit-channel that includes a G operation. Given respective weights for Stage 0, Stage 1, and Stage 2 of Weight(0), Weight(1), and Weight(2), the polarization weights, $W_i$, of the bit-channels i 610 associated with the polarized bit locations, $U_i$, are shown in FIG. 6. The polarization weight of the bit-channel 610 associated with polarized bit location $U_5$, for example, is:

$$\text{Weight}(0) + \text{Weight}(2)$$

Given the polarization weights associated with bit-channels 610, a set of information bit locations of a polar code may be determined, and a codeword may be processed using the polar code decoder 600 to obtain an information bit vector at the set of information bit locations.

Figure 7:
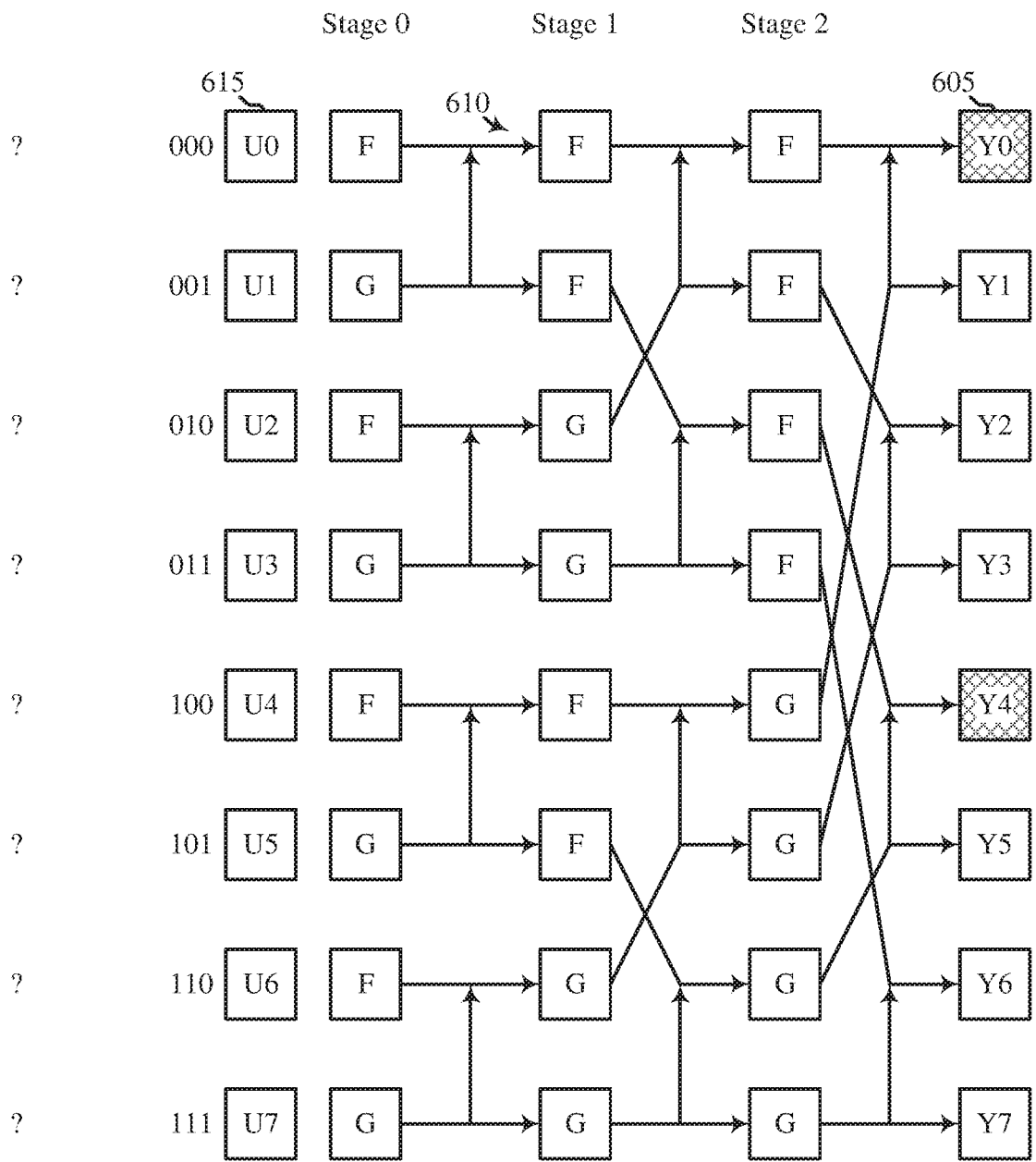
FIGS. 7-10 illustrate the polar code decoder described with reference to FIG. 6 when receiving a codeword Y including a set of punctured bit locations, in accordance with various aspects of the present disclosure.
Figure 8:
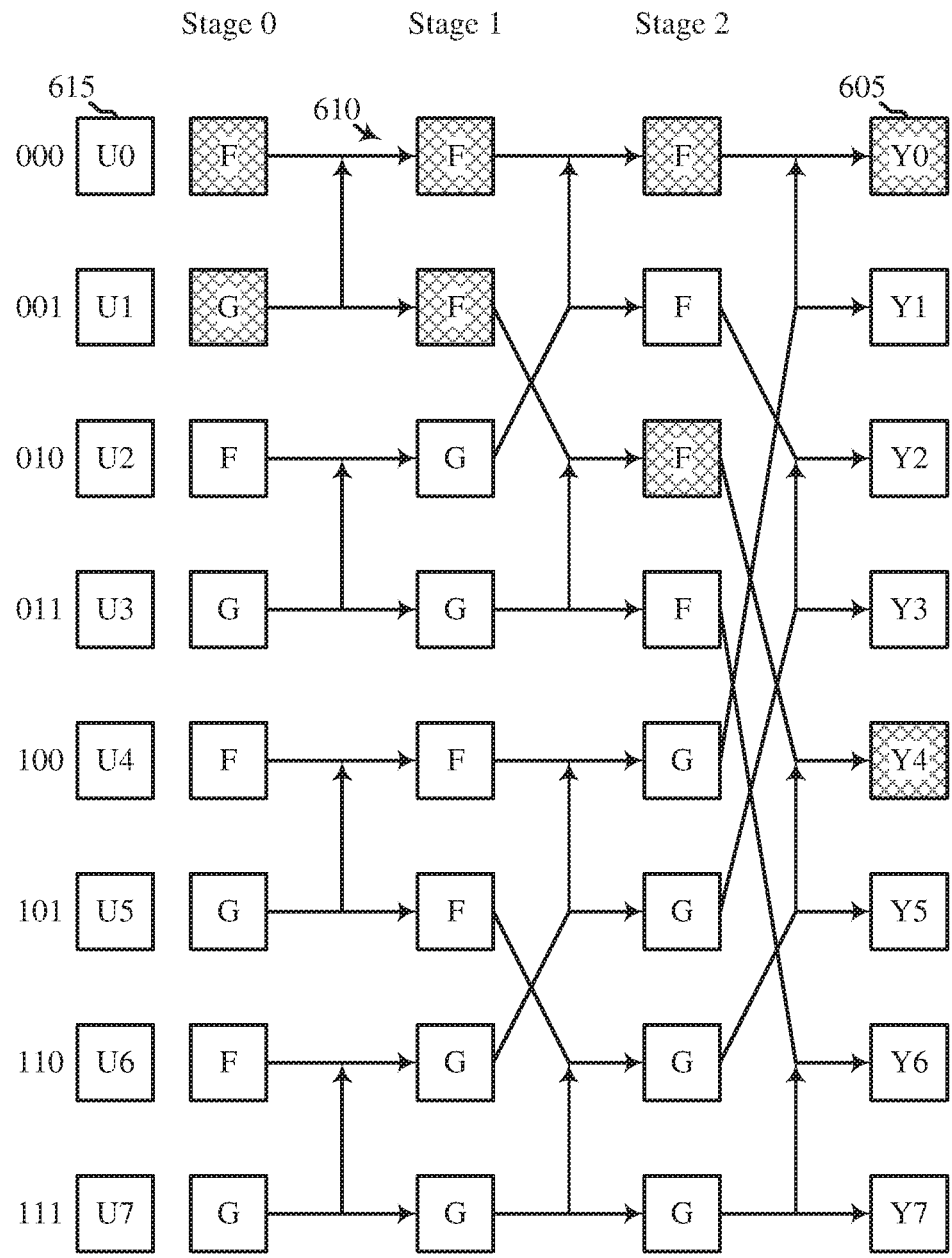
Figure 9:
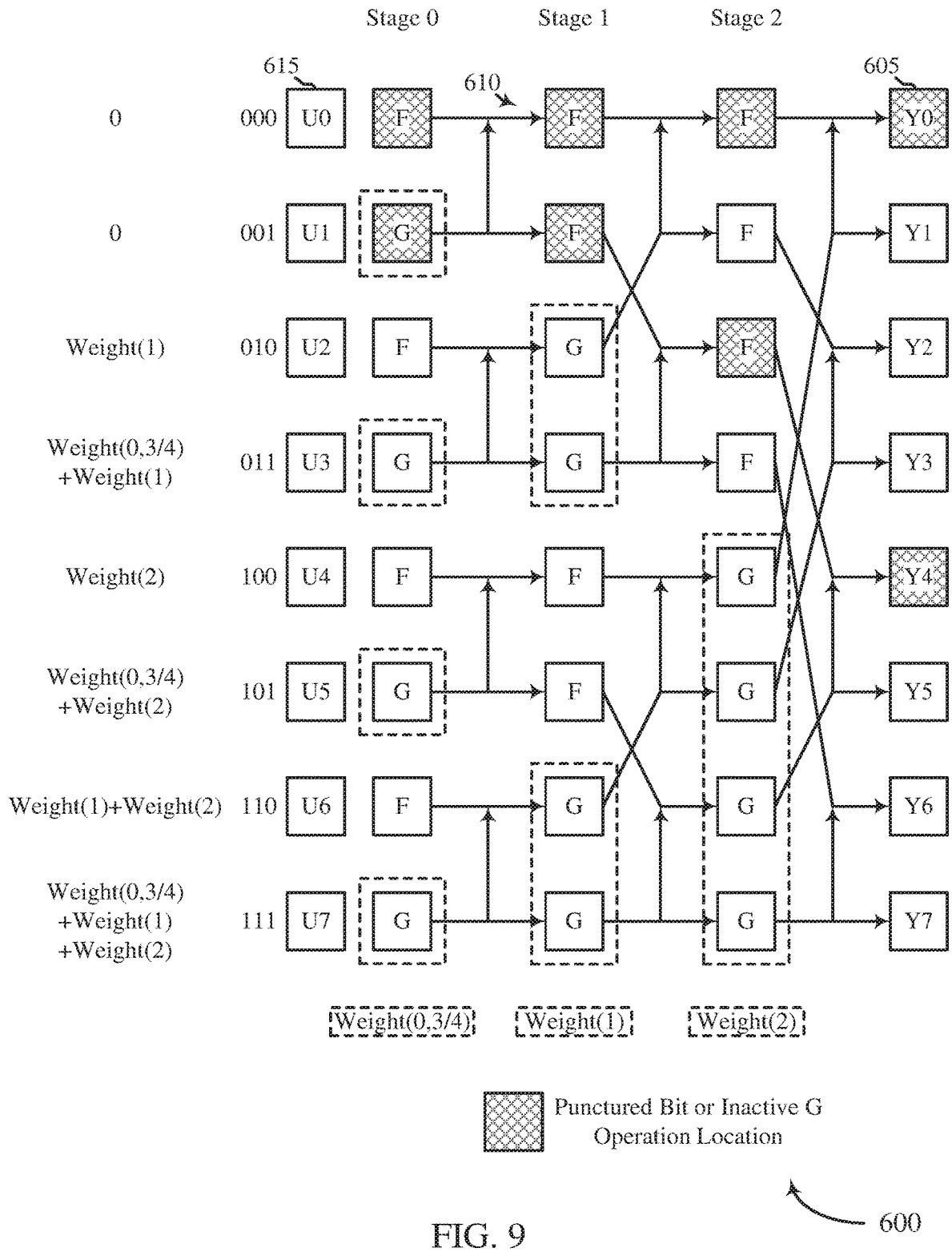

FIG. 7 illustrates the polar code decoder 600 described with reference to FIG. 6 when receiving a codeword Y including a set of punctured bit locations, in accordance with various aspects of the present disclosure. By way of example, the codeword is punctured according to a block puncturing, and the set of punctured bit locations includes the two LSBs of the naturally-ordered codeword Z corresponding to the codeword Y. Given the punctured bit locations (i.e., unpolarized bit locations Y0 and Y4), which punctured bit locations may contain no information (e.g., an indeterminate LLR), the ranking of bit-channels and polarized bit locations 615 provided by the polarization weights determined with reference to FIG. 6 may not be valid. FIGS. 8-9 therefore describe a modified polarization weight method.

FIG. 8 illustrates the polar code decoder 600 described with reference to FIG. 6 when receiving a codeword Y including a set of punctured bit locations, in accordance with various aspects of the present disclosure. FIG. 8 and further illustrates nulled repetition operations determined based at least in part on the set of punctured bit locations. By way of example, the codeword is punctured according to a block puncturing, and the set of punctured bit locations includes the two LSBs of the naturally-ordered codeword Z corresponding to the codeword Y, as described with reference to FIG. 7.

In accordance with the modified polarization weight method, nulled repetition operations may be determined based at least in part on the set of punctured bit locations. In some examples, nulled repetition operations may be determined based at least in part on the following rules: 1) an F operation propagates a 0 (i.e., a LLR that provides no further information about the identity of a bit) if one of the operands of the function is 0, and 2) a G operation propagates a 0 if both of the operands of the function is 0. Thus, $$F(0,b)=0$$

$$F(a,0)=0$$

$$G(0,0)=0$$

where a and b are respective less significant bit and more significant bit inputs to the F and G operations. Thus, to determine nulled repetition operations from the punctured bit locations, the stages may be back-tracked according to these rules. Given these rules, and based at least in part on the puncture of unpolarized bit locations Y0 and Y4, all of the operations in the bit-channel 610 associated with polarized bit location U0 are determined to be inactive; the Stage 0 and Stage 1 operations in the bit-channel 610 associated with polarized bit location U1 are determined to be inactive; and the Stage 2 operation associated with the bit channel 610 associated with the polarized bit location U2 is determined to be inactive.

Across all bit-channels 610, the inactive operations include one nulled repetition operation in Stage 0, and no nulled repetition operations in Stage 1 or Stage 2. Thus, only ¾ of the G operations in Stage 0 are active, and all of the G operations in Stage 1 and Stage 2 are active.

FIG. 9 illustrates the polar code decoder 600 described with reference to FIG. 6 when receiving a codeword Y including a set of punctured bit locations, in accordance with various aspects of the present disclosure. FIG. 9 further illustrates nulled repetition operations determined based at least in part on the set of punctured bit locations, and polarization weights determined as a function of the nulled repetition operations. By way of example, the codeword is punctured according to a block puncturing, and the set of punctured bit locations includes the two LSBs of the naturally-ordered codeword Z corresponding to the codeword Y, as described with reference to FIGS. 7 and 8.

In accordance with the modified polarization weight method, a polarization weight, $W_i$, of a bit-channel i 610 associated with a polarized bit location, $U_i$, may be defined as:

$$W_i = \Sigma_{j=0}^{m-1} B_j \times \text{weight}(j,\alpha)$$

where α is a polarization weight factor based at least in part on a total number of G operations for a stage j and a number of nulled repetition operations for the stage j. In some examples, α may be determined as a ratio of active (i.e., non-nulled) repetition operations in a stage j to the total number of G operations (including active repetition operations and nulled repetition operations) in a stage j, or based at least in part on the example shown in FIGS. 8 and 9, α=¾ for Stage 0, α=1 for Stage 1, and α=1 for Stage 2. In some cases, a set of active repetition operations may be classified to be nulled or not active. In some examples, the value of weight(j,α) may be determined by scaling weight(j) by a. For example, weight(j,α) may be determined as:

$$\text{weight}(j,\alpha) = \alpha \times \text{weight}(j) = \alpha \times 2j/4$$

The polarization weight of each bit-channel 610 may be determined by the polarization weight, $W_i$ as given above, where $B_j$ is 1 for an active repetition operation in stage j, and 0 for an nulled repetition operation in stage j. Thus, the polarization weight of the bit-channel 610 associated with polarized bit location $U_2$ is 0 while the polarization weight of the bit-channel 610 associated with polarized bit location $U_5$, for example, is:

$$\text{Weight}(0,¾) + \text{Weight}(2)$$

Given the polarization weights associated with bit-channels 610, a set of information bit locations of a polar code may be determined, and a codeword may be processed using the polar code decoder 600 to obtain an information bit vector at the set of information bit locations. Although described with respect to a polar code decoder 600, a polar code encoder may perform similar operations to determine bit locations for information bits in an encoding process.

Figure 10:
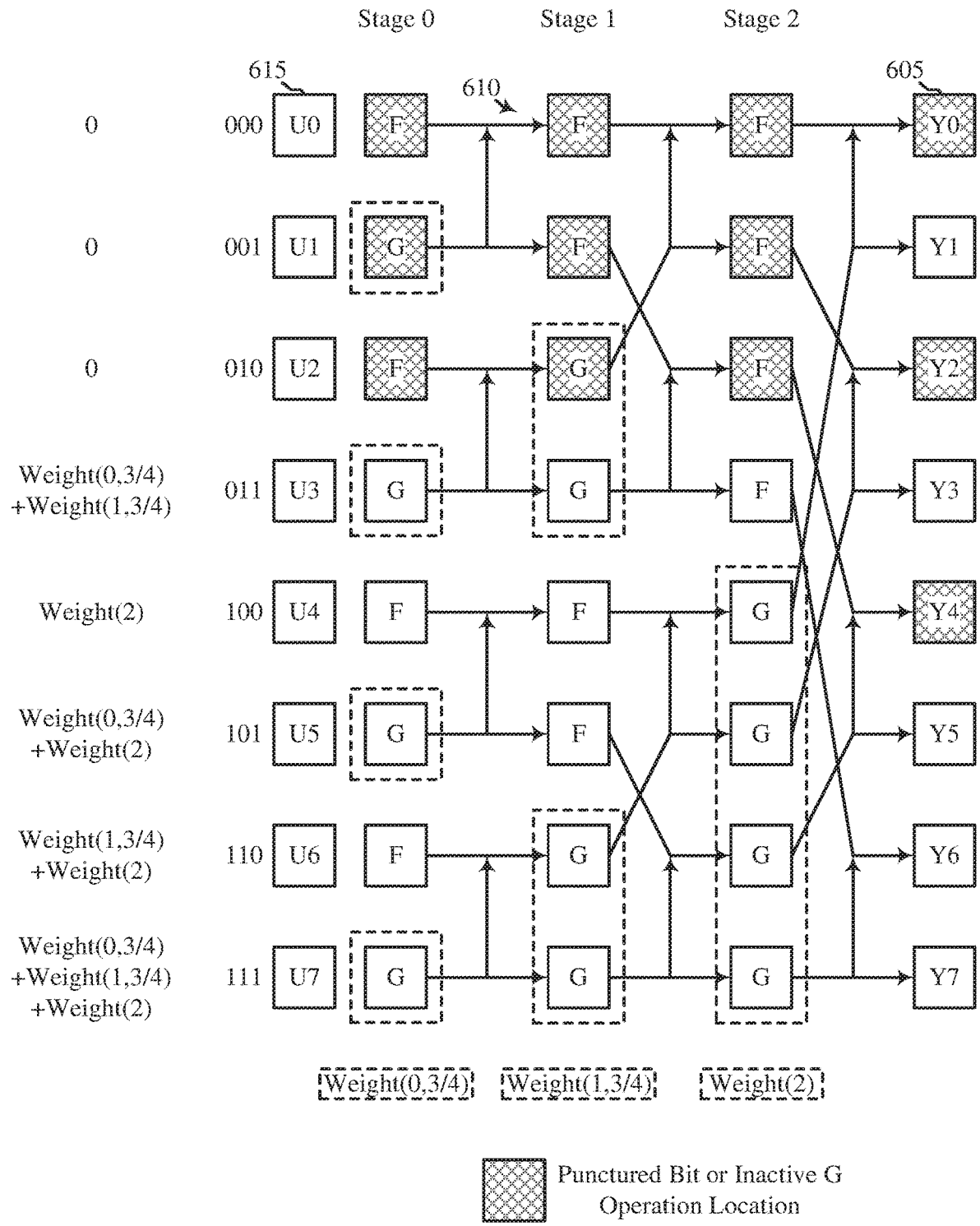

FIG. 10 shows a second example of the modified polarization weight method described with reference to FIGS. 8 and 9.

FIG. 10 illustrates the polar code decoder 600 described with reference to FIG. 6 when receiving a codeword Y including a set of punctured bit locations, in accordance with various aspects of the present disclosure. FIG. 10 further illustrates nulled repetition operations determined based at least in part on the set of punctured bit locations, and polarization weights determined as a function of the nulled repetition operations. The polar code decoder 600 may be included in a receiver, such as a receiver included in one of the UEs 115 or base stations 105 described with reference to FIG. 1. The polar code decoder 600 may be an example of aspects of the encoder/decoder 210 described with reference to FIG. 2. By way of example, the polar code decoder 600 is an 8-bit decoder.

The decoder 600 may receive a plurality of LLRs associated with a plurality of bits of a received codeword (e.g., an 8-bit codeword Y), similarly to the decoders 400, 500, and 600. The bits of the received codeword may be encoded using a polar code. The plurality of LLRs may be received at a plurality of unpolarized bit locations 605 of a plurality of interconnected bit-channels 610 of the decoder 600. The plurality of LLRs may be transformed into an output vector, U, at a plurality of polarized bit locations 615 of the bit-channels 610, by a plurality of operations performed on the bit-channels 610. The operations may include a number of SPC operations (e.g., F operations) and a number of repetition operations (e.g., G operations). The blocks labeled F and G represent the outputs of such operations, with each F operation being performed where the upper end of a vertical arrow segment intersects a horizontal arrow segment, and with each G operation being performed where the lower end of a vertical arrow segment intersects a horizontal arrow segment. By way of example, the decoder 600 is shown to perform twelve F operations and twelve G operations, distributed amongst three stages (i.e., a Stage 0, a Stage 1, and a Stage 2). Each F operation and G operation may be implemented as described with reference to FIG. 4.

The codeword Y received by the decoder 600 may be punctured according to a block puncturing, with the set of punctured bit locations including the three LSBs of the naturally-ordered codeword Z corresponding to the codeword Y. In accordance with the modified polarization weight method described with reference to FIGS. 8 and 9, nulled repetition operations may be determined based at least in part on the set of punctured bit locations, as described for example with reference to FIG. 8. Based at least in part on the puncture of unpolarized bit locations Y0, Y2, and Y4, all of the operations in the bit-channels 610 associated with polarized bit locations U0, U1, and U2 are determined to be inactive.

Across all bit-channels 610, the inactive operations include one nulled repetition operation in Stage 0, one nulled repetition operation in Stage 1, and no nulled repetition operations in Stage 2. Thus, only ¾ of the G operations in Stage 0 and Stage 1 are active, and all of the G operations in Stage 2 are active.

In further accordance with the modified polarization weight method, a polarization weight, $W_i$, of a bit-channel i 610 associated with a polarized bit location, $U_i$, may be defined as:

$$W_i = \Sigma_{j=0}^{m-1} B_j \times \text{weight}(j,\alpha)$$

In some examples, a may be determined as a ratio of active repetition operations in a stage j to the total number of G operations in a stage j, or based at least in part on the example shown in FIG. 10, α=¾ for Stage 0, α=¾ for Stage 1, and α=1 for Stage 2. Thus, the polarization weight of the bit-channel 610 associated with polarized bit location $U_5$, for example, is:

Weight(0,¾)+Weight(2)

Given the polarization weights associated with bit-channels 610, a set of information bit locations of a polar code may be determined, and a codeword may be processed using the polar code decoder 600 to obtain an information bit vector at the set of information bit locations.

Figure 11:
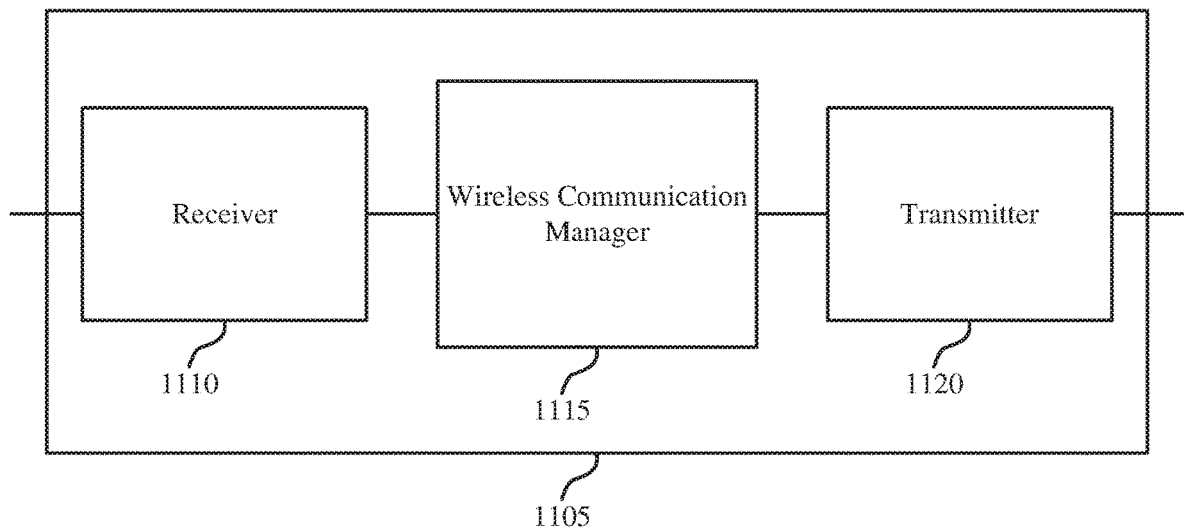
FIGS. 11 and 12 show block diagrams of wireless devices, in accordance with various aspects of the present disclosure.

FIG. 11 shows a block diagram 1100 of a wireless device 1105, in accordance with various aspects of the present disclosure. The wireless device 1105 may be an example of aspects of a UE 115 or base station 105 described with reference to FIG. 1. The wireless device 1105 may include a receiver 1110, a wireless communication manager 1115, and a transmitter 1120. The wireless device 1105 may also include a processor. Each of these components may be in communication with one another (e.g., via one or more buses).

The receiver 1110 may receive signaling via an antenna. In some examples, the signaling may be encoded in one or more codewords using a polar code. The receiver may process the signaling (e.g., downconversion, filtering, analog-to-digital conversion, baseband processing) and may pass the processed signaling on to other components of the wireless device 1105. The receiver 1110 may include a single antenna or a set of antennas.

The wireless communication manager 1115 and/or at least some of its various sub-components may be implemented in hardware, software executed by a processor, firmware, or any combination thereof. If implemented in software executed by a processor, the functions of the wireless communication manager 1115 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof.

The wireless communication manager 1115 and/or at least some of its various sub-components may be physically located at various positions, including being distributed such that portions of functions are implemented at different physical locations by one or more physical devices. In some examples, the wireless communication manager 1115 and/or at least some of its various sub-components may be a separate and distinct component in accordance with various aspects of the present disclosure. In other examples, the wireless communication manager 1115 and/or at least some of its various sub-components may be combined with one or more other hardware components, including but not limited to an I/O component, a transceiver, a network server, another computing device, one or more other components described in the present disclosure, or a combination thereof, in accordance with various aspects of the present disclosure. The wireless communication manager 1115 may be an example of aspects of the UE wireless communication manager 1450 or base station wireless communication manager 1560 described with reference to FIG. 14 or 15.

The wireless communication manager 1115 may identify a set of punctured bit locations in a received codeword. The received codeword may be encoded using a polar code. The wireless communication manager 1115 may also identify a set of information bit locations of the polar code, with the set of information bit locations being determined based at least in part on polarization weights per polarized bit-channel of a polar code decoder that are a function of nulled repetition operations per polarization stage of the polar code identified based at least in part on the set of punctured bit locations. The wireless communication manager 1115 may further process the received codeword using the polar code decoder to obtain an information bit vector at the set of information bit locations.

The transmitter 1120 may transmit signals generated by other components of the wireless device 1105. In some examples, the transmitter 1120 may be collocated with the receiver 1110 in a transceiver. For example, the transmitter 1120 and receiver 1110 may be an example of aspects of the transceiver 1435 or 1535 described with reference to FIG. 14 or 15. The transmitter 1120 may include a single antenna or a set of antennas.

Figure 12:
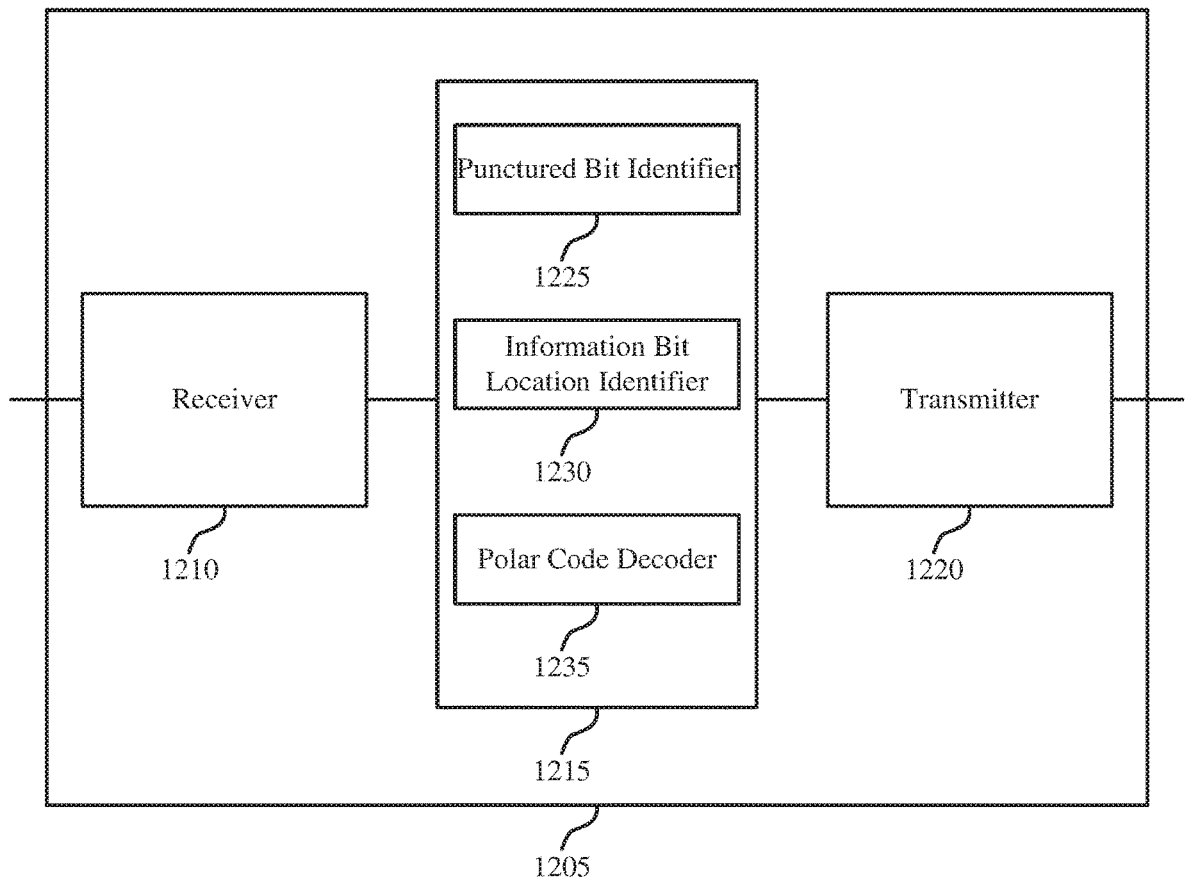

FIG. 12 shows a block diagram 1200 of a wireless device 1205, in accordance with various aspects of the present disclosure. The wireless device 1205 may be an example of aspects of a wireless device, UE, or base station described with reference to FIGS. 1 and 11. The wireless device 1205 may include a receiver 1210, a wireless communication manager 1215, and a transmitter 1220. The wireless device 1205 may also include a processor. Each of these components may be in communication with one another (e.g., via one or more buses).

The receiver 1210 may receive signaling via an antenna. The receiver 1210 may an example of the receiver 1110 of FIG. 11.

The wireless communication manager 1215 may include a punctured bit identifier 1225, an information bit location identifier 1230, and a polar code decoder 1235. The wireless communication manager 1215 may be an example of aspects of the wireless communication manager 1115, 1450, or 1560 described with reference to FIG. 11, 14, or 15.

The punctured bit identifier 1225 may be used to identify a set of punctured bit locations in a received codeword. The received codeword may be encoded using a polar code.

The information bit location identifier 1230 may be used to identify a set of information bit locations of the polar code. The set of information bit locations may be determined based at least in part on polarization weights per polarized bit-channel of a polar code decoder that are a function of nulled repetition operations per polarization stage of the polar code identified based at least in part on the set of punctured bit locations.

The polar code decoder 1235 may be used to process the received codeword using the polar code decoder to obtain an information bit vector at the set of information bit locations. In some examples, the polar code decoder may be a natural bit order polar decoder or a bit-reversed order polar code decoder.

The transmitter 1220 may transmit signals generated by other components of the wireless device 1205. In some examples, the transmitter 1220 may be collocated with the receiver 1210 in a transceiver. For example, the transmitter 1220 and receiver 1210 may be an example of aspects of the transceiver 1435 or 1535 described with reference to FIG. 14 or 15. The transmitter 1220 may include a single antenna or a set of antennas.

Figure 13:
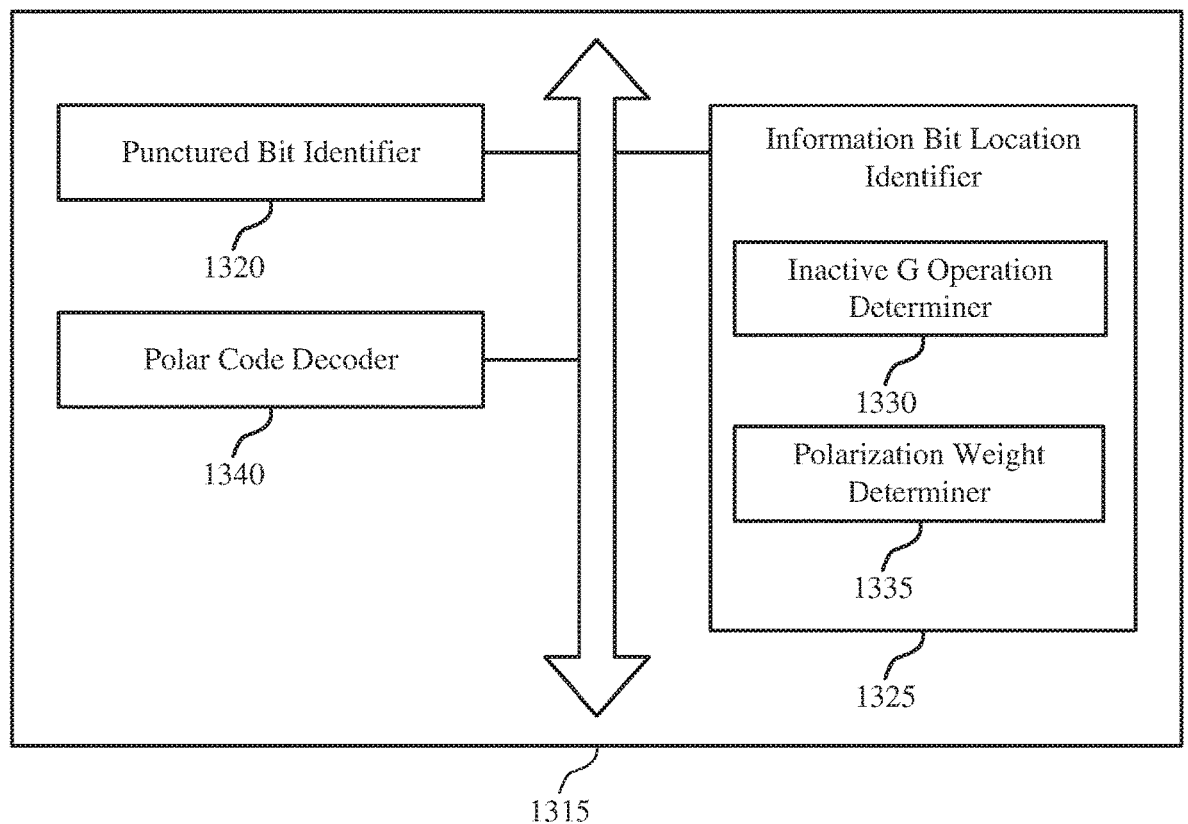
FIG. 13 shows a block diagram of a wireless communication manager, in accordance with various aspects of the present disclosure.

FIG. 13 shows a block diagram 1300 of a wireless communication manager 1315, in accordance with various aspects of the present disclosure. The wireless communication manager 1315 may be an example of aspects of a wireless communication manager described with reference to FIG. 11, 12, 14, or 15. The wireless communication manager 1315 may include a punctured bit identifier 1320, an information bit location identifier 1325, and a polar code decoder 1340. The information bit location identifier 1325 may include an nulled repetition operation determiner 1330 and a polarization weight determiner 1335. Each of these components may communicate, directly or indirectly, with one another (e.g., via one or more buses).

The punctured bit identifier 1320 may be used to identify a set of punctured bit locations in a received codeword. The received codeword may be encoded using a polar code.

The information bit location identifier 1325 may be used to identify a set of information bit locations of the polar code. The set of information bit locations may be determined based at least in part on polarization weights per polarized bit-channel of a polar code decoder that are a function of nulled repetition operations per polarization stage of the polar code identified based at least in part on the set of punctured bit locations. For example, the set of information bit locations may be determined based at least in part on a ranking of the polarization weights per polarized bit-channel of the polar code decoder.

The nulled repetition operation determiner 1330 may be used to determine, based at least in part on the set of punctured bit locations, respective numbers of the nulled repetition operations per polarization stage of the polar code.

The polarization weight determiner 1335 may be used to determine, based at least in part on the respective numbers of the nulled repetition operations per polarization stage, the polarization weights per polarized bit-channel of the polar code decoder. In some examples, the polarization weight determiner 1335 may be used to identify, for each polarization stage having one or more nulled repetition operations, a polarization weight factor based at least in part on a total number of repetition operations (e.g., a number of the active repetition operations plus the nulled repetition operations) for the each polarization stage and a respective number of the nulled repetition operations for the each polarization stage. In some examples, the polarization weight factor for a polarization stage may be based at least in part on a ratio of active repetition operations in the polarization stage to the total number of repetition operations in the polarization stage. In some examples, the polarization weight determiner 1335 may also be used to generate a polarization weight for each of the polarized bit-channels by combining a set of polarization stage weights associated with each active repetition operation of the each of the polarized bit-channels. Each polarization stage weight of the set of polarization stage weights may be based at least in part on the polarization weight factor for a corresponding polarization stage. In some examples, the set of polarization stage weights may be determined by the polarization stage weight associated with the each active repetition operation scaled by the polarization weight factor for the corresponding polarization stage of the each active repetition operation.

The polar code decoder 1340 may be used to process the received codeword using the polar code decoder to obtain an information bit vector at the set of information bit locations. In some examples, the polar code decoder may be a natural bit order polar decoder or a bit-reversed order polar code decoder.

Figure 14:
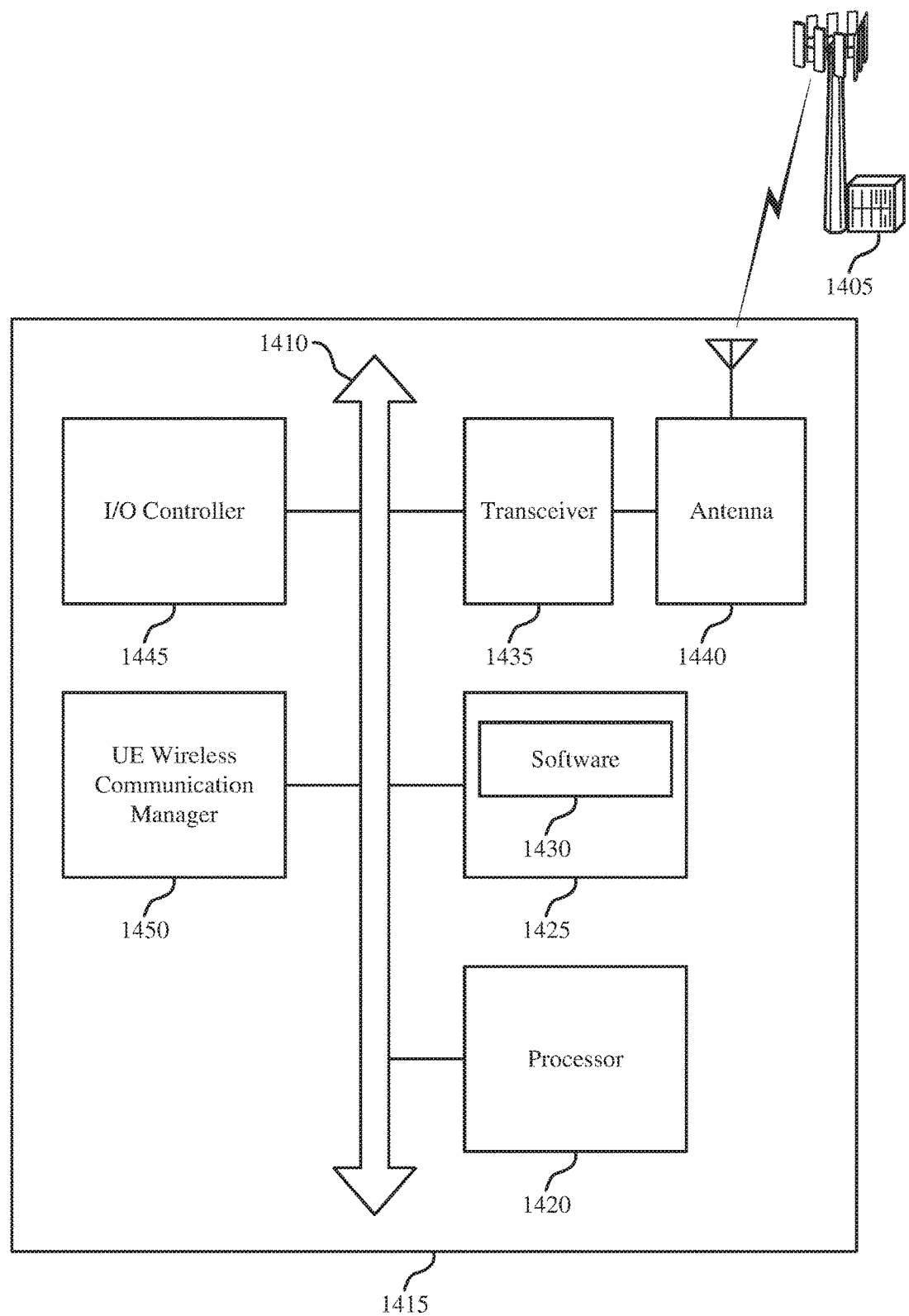
FIG. 14 shows a diagram of a system including a device that supports wireless communication, in accordance with various aspects of the present disclosure.

FIG. 14 shows a diagram of a system 1400 including a device 1415 that supports wireless communication, in accordance with various aspects of the present disclosure, the device 1415 may be an example of aspects of the wireless device 1105 or 1205 described with reference to FIG. 11 or 12, or aspects of a UE described with reference to FIG. 1. The device 1415 may include components for bi-directional voice and data communications, including components for transmitting and receiving communications. The device 1415 may include a UE wireless communication manager 1450, a processor 1420, a memory 1425, software 1430, a transceiver 1435, an antenna 1440, and an I/O controller 1445. These components may be in electronic communication via one or more busses (e.g., bus 1410). The device 1415 may communicate wirelessly with one or more base stations 1405.

The processor 1420 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 1420 may be configured to operate a memory array using a memory controller. In other cases, a memory controller may be integrated into the processor 1420. The processor 1420 may be configured to execute computer-readable instructions stored in a memory to perform various functions (e.g., functions or tasks supporting polar code encoding/decoding, etc.).

The memory 1425 may include random access memory (RAM) and read only memory (ROM). The memory 1425 may store computer-readable, computer-executable software 1430 including instructions that, when executed, cause the processor to perform various functions described herein. In some cases, the memory 1425 may contain, among other things, a basic input/output system (BIOS) which may control basic hardware and/or software operation such as the interaction with peripheral components or devices.

The software 1430 may include code to implement aspects of the present disclosure, including code to support polar code encoding/decoding, etc. The software 1430 may be stored in a non-transitory computer-readable medium such as system memory or other memory. In some cases, the software 1430 may not be directly executable by the processor but may cause a computer (e.g., when compiled and executed) to perform functions described herein.

The transceiver 1435 may communicate bi-directionally, via one or more antennas, wired, or wireless links as described above. For example, the transceiver 1435 may represent a wireless transceiver and may communicate bi-directionally with another wireless transceiver. The transceiver 1435 may also include a modem to modulate the packets and provide the modulated packets to the antennas for transmission, and to demodulate packets received from the antennas.

In some cases, the device 1415 may include a single antenna 1440. However, in some cases, the device 1415 may have more than one antenna 1440, which may be capable of concurrently transmitting or receiving multiple wireless transmissions.

The I/O controller 1445 may manage input and output signals for the device 1415. The I/O controller 1445 may also manage peripherals that are not integrated into the device 1415. In some cases, the I/O controller 1445 may represent a physical connection or port to an external peripheral. In some cases, the I/O controller 1445 may utilize an operating system such as iOS®, ANDROID®, MS-DOS®, MS-WINDOWS®, OS/2®, UNIX®, LINUX®, or another known operating system. In other cases, the I/O controller 1445 may represent or interact with a modem, a keyboard, a mouse, a touchscreen, or a similar device. In some cases, the I/O controller 1445 may be implemented as part of a processor. In some cases, a user may interact with the device 1415 via the I/O controller 1445, or via hardware components controlled by the I/O controller 1445.

Figure 15:
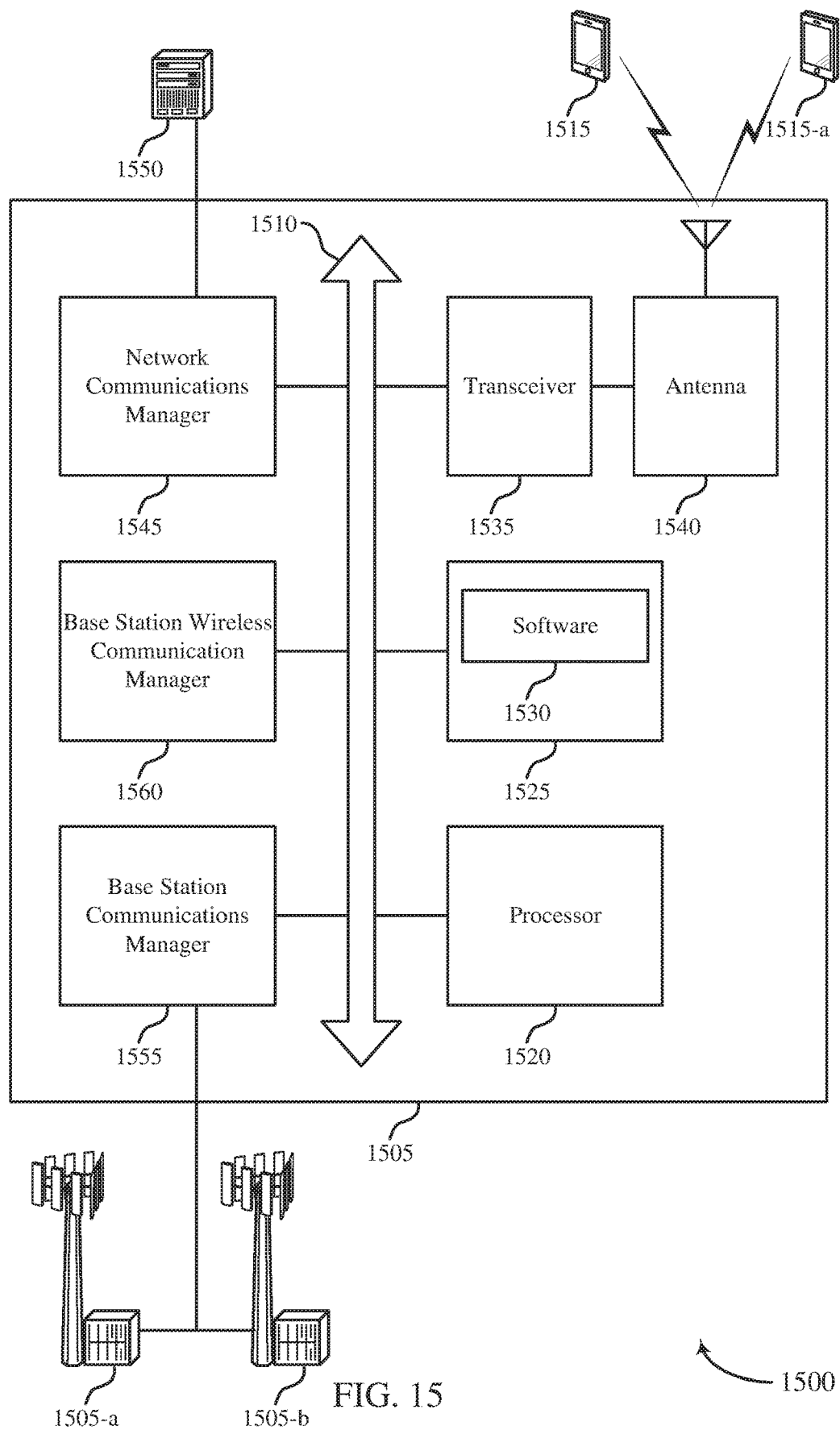
FIG. 15 shows a diagram of a system including a base station that supports wireless communication, in accordance with various aspects of the present disclosure.

FIG. 15 shows a diagram of a system 1500 including a base station 1505 that supports wireless communication, in accordance with various aspects of the present disclosure. The base station 1505 may be an example of aspects of the wireless device 1105 or 1205 described with reference to FIG. 11 or 12, or aspects of a base station described with reference to FIG. 1. The base station 1505 may include components for bi-directional voice and data communications, including components for transmitting and receiving communications. The base station 1505 may include a base station wireless communication manager 1560, a processor 1520, a memory 1525, software 1530, a transceiver 1535, an antenna 1540, a network communication manager 1545, and a base station communication manager 1555. These components may be in electronic communication via one or more busses (e.g., bus 1510). The base station 1505 may communicate wirelessly with one or more UEs 1515 or 1515-*a*.

The processor 1520 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1520 may be configured to operate a memory array using a memory controller. In other cases, a memory controller may be integrated into the processor 1520. The processor 1520 may be configured to execute computer-readable instructions stored in a memory to perform various functions (e.g., functions or tasks supporting polar code encoding/decoding, etc.).

The memory 1525 may include RAM and ROM. The memory 1525 may store computer-readable, computer-executable software 1530 including instructions that, when executed, cause the processor to perform various functions described herein. In some cases, the memory 1525 may contain, among other things, a BIOS which may control basic hardware and/or software operation such as the interaction with peripheral components or devices.

The software 1530 may include code to implement aspects of the present disclosure, including code to support polar code encoding/decoding, etc. The software 1530 may be stored in a non-transitory computer-readable medium such as system memory or other memory. In some cases, the software 1530 may not be directly executable by the processor but may cause a computer (e.g., when compiled and executed) to perform functions described herein.

The transceiver 1535 may communicate bi-directionally, via one or more antennas, wired, or wireless links as described above. For example, the transceiver 1535 may represent a wireless transceiver and may communicate bi-directionally with another wireless transceiver. The transceiver 1535 may also include a modem to modulate the packets and provide the modulated packets to the antennas for transmission, and to demodulate packets received from the antennas.

In some cases, the base station 1505 may include a single antenna 1540. However, in some cases the base station 1505 may have more than one antenna 1540, which may be capable of concurrently transmitting or receiving multiple wireless transmissions.

The network communication manager 1545 may manage communications with the core network (e.g., via one or more wired backhaul links). For example, the network communication manager 1545 may manage the transfer of data communications for client devices, such as one or more UFs 1515 or 1515-*a*.

The base station communication manager 1555 may manage communications with other base stations 1505-*a* and 1505-*b*, and may include a controller or scheduler for controlling communications with UEs 1515 and 1515-*a* in cooperation with other base stations 1505-*a* and 1505-*b*. For example, the base station communication manager 1555 may coordinate scheduling for transmissions to UEs 1515 and 1515-*a* for various interference mitigation techniques such as beamforming or joint transmission. In some examples, the base station communication manager 1555 may provide an X2 interface within an Long Term Evolution (LTE)/LTE-A wireless communication network technology to provide communication between base stations 1505, 1505-*a* and 1505-*b*.

Figure 16:
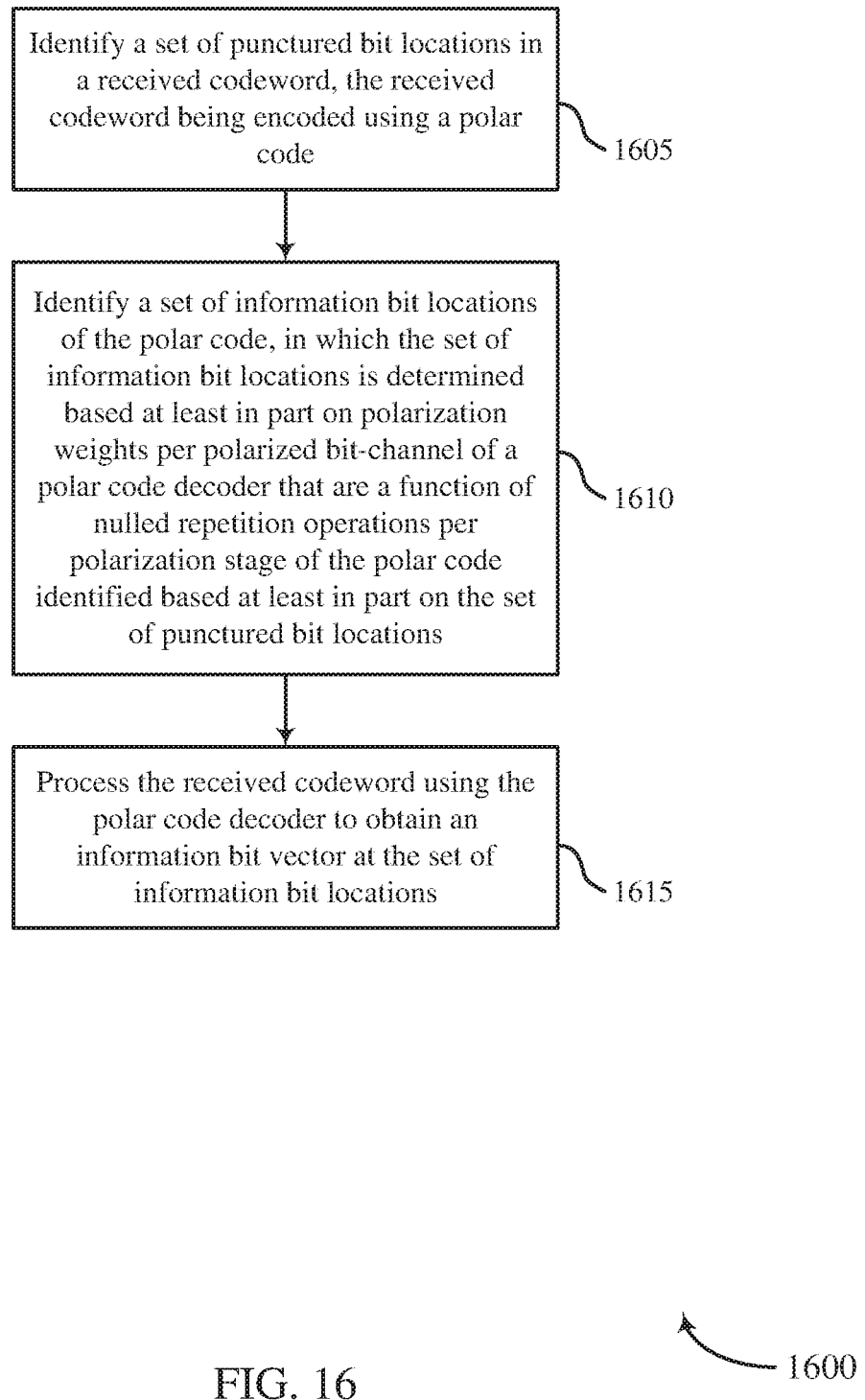
FIGS. 16-18 show flowcharts illustrating methods of wireless communication, in accordance with various aspects of the present disclosure.

FIG. 16 shows a flowchart illustrating a method 1600 of wireless communication, in accordance with various aspects of the present disclosure. The operations of the method 1600 may be performed by a wireless device (e.g., a UE or a base station) or its components, as described herein. For example, the operations of the method 1600 may be performed by a wireless communication manager, as described with reference to FIGS. 11 through 14. In some examples, a wireless device may execute a set of codes to control the functional elements of the wireless device to perform the functions described below. Additionally or alternatively, the wireless device may perform aspects of the functions described below using special-purpose hardware.

At block 1605, a wireless device may identify a set of punctured bit locations in a received codeword. The received codeword may be encoded using a polar code. The operation(s) of block 1605 may be performed according to the techniques described with reference to FIGS. 2 through 10. In certain examples, aspects of the operation(s) of block 1605 may be performed using a punctured bit identifier, as described with reference to FIGS. 12 and 13.

At block 1610, the wireless device may identify a set of information bit locations of the polar code. The set of information bit locations may be determined based at least in part on polarization weights per polarized bit-channel of a polar code decoder that are a function of nulled repetition operations per polarization stage of the polar code identified based at least in part on the set of punctured bit locations. The operation(s) of block 1610 may be performed according to the techniques described with reference to FIGS. 2 through 10. In certain examples, aspects of the operation(s) of block 1610 may be performed using an information bit location identifier, as described with reference to FIGS. 12 and 13.

At block 1615, the wireless device may process the received codeword using the polar code decoder to obtain an information bit vector at the set of information bit locations. In some examples, the polar code decoder may be a natural bit order polar decoder or a bit-reversed order polar code decoder. The operation(s) of block 1615 may be performed according to the techniques described with reference to FIGS. 2 through 10. In certain examples, aspects of the operation(s) of block 1615 may be performed using a polar code decoder, as described with reference to FIGS. 12 and 13.

Figure 17:
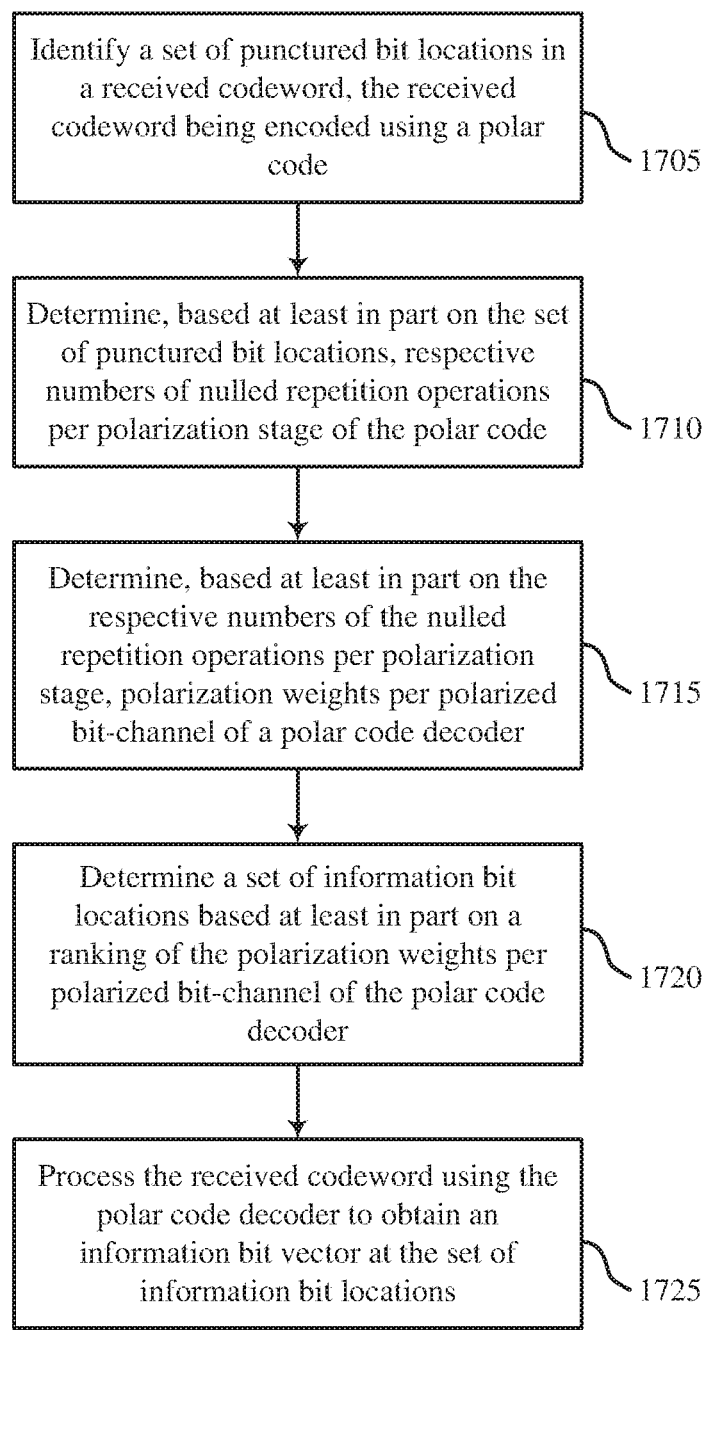

FIG. 17 shows a flowchart illustrating a method 1700 of wireless communication, in accordance with various aspects of the present disclosure. The operations of the method 1700 may be performed by a wireless device (e.g., a UE or a base station) or its components, as described herein. For example, the operations of the method 1700 may be performed by a wireless communication manager, as described with reference to FIGS. 11 through 14. In some examples, a wireless device may execute a set of codes to control the functional elements of the wireless device to perform the functions described below. Additionally or alternatively, the wireless device may perform aspects of the functions described below using special-purpose hardware.

At block 1705, a wireless device may identify a set of punctured bit locations in a received codeword. The received codeword may be encoded using a polar code. The operation(s) of block 1705 may be performed according to the techniques described with reference to FIGS. 2 through 10. In certain examples, aspects of the operation(s) of block 1705 may be performed using a punctured bit identifier, as described with reference to FIGS. 12 and 13.

At blocks 1710, 1715, and 1720, the wireless device may identify a set of information bit locations of the polar code. The set of information bit locations may be determined based at least in part on polarization weights per polarized bit-channel of a polar code decoder that are a function of nulled repetition operations per polarization stage of the polar code identified based at least in part on the set of punctured bit locations.

At block 1710, the wireless device may determine, based at least in part on the set of punctured bit locations, respective numbers of the nulled repetition operations per polarization stage of the polar code. The operation(s) of block 1710 may be performed according to the techniques described with reference to FIGS. 2 through 10. In certain examples, aspects of the operation(s) of block 1710 may be performed using an information bit location identifier, as described with reference to FIGS. 12 and 13, or an nulled repetition operation determiner, as described with reference to FIG. 13.

At block 1715, the wireless device may determine, based at least in part on the respective numbers of the nulled repetition operations per polarization stage, the polarization weights per polarized bit-channel of the polar code decoder. The operation(s) of block 1710 may be performed according to the techniques described with reference to FIGS. 2 through 10. In certain examples, aspects of the operation(s) of block 1715 may be performed using an information bit location identifier, as described with reference to FIGS. 12 and 13, or a polarization weight determiner, as described with reference to FIG. 13.

At block 1720, the wireless device may determine the set of information bit locations based at least in part on a ranking of the polarization weights per polarized bit-channel of the polar code decoder. The operation(s) of block 1720 may be performed according to the techniques described with reference to FIGS. 2 through 10. In certain examples, aspects of the operation(s) of block 1720 may be performed using an information bit location identifier, as described with reference to FIGS. 12 and 13.

At block 1725, the wireless device may process the received codeword using the polar code decoder to obtain an information bit vector at the set of information bit locations. In some examples, the polar code decoder may be a natural bit order polar decoder or a bit-reversed order polar code decoder. The operation(s) of block 1725 may be performed according to the techniques described with reference to FIGS. 2 through 10. In certain examples, aspects of the operation(s) of block 1725 may be performed using a polar code decoder, as described with reference to FIGS. 12 and 13.

Figure 18:
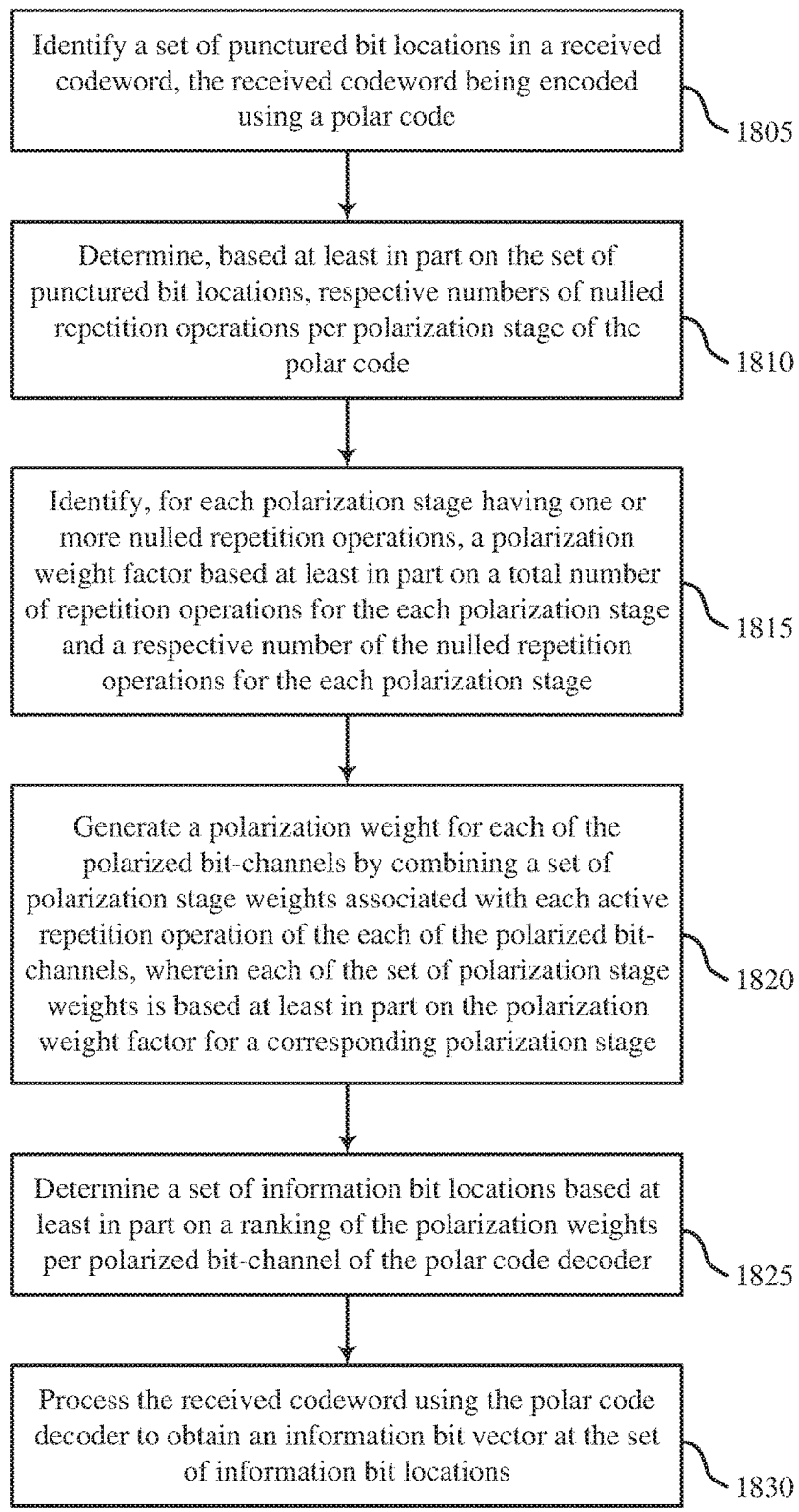

FIG. 18 shows a flowchart illustrating a method 1800 of wireless communication, in accordance with various aspects of the present disclosure. The operations of the method 1800 may be performed by a wireless device (e.g., a UE or a base station) or its components, as described herein. For example, the operations of the method 1800 may be performed by a wireless communication manager, as described with reference to FIGS. 11 through 14. In some examples, a wireless device may execute a set of codes to control the functional elements of the wireless device to perform the functions described below. Additionally or alternatively, the wireless device may perform aspects of the functions described below using special-purpose hardware.

At block 1805, a wireless device may identify a set of punctured bit locations in a received codeword. The received codeword may be encoded using a polar code. The operation(s) of block 1805 may be performed according to the techniques described with reference to FIGS. 2 through 10. In certain examples, aspects of the operation(s) of block 1805 may be performed using a punctured bit identifier, as described with reference to FIGS. 12 and 13.

At blocks 1810, 1815, and 1820, the wireless device may identify a set of information bit locations of the polar code. The set of information bit locations may be determined based at least in part on polarization weights per polarized bit-channel of a polar code decoder that are a function of nulled repetition operations per polarization stage of the polar code identified based at least in part on the set of punctured bit locations.

At block 1810, the wireless device may determine, based at least in part on the set of punctured bit locations, respective numbers of the nulled repetition operations per polarization stage of the polar code. The operation(s) of block 1810 may be performed according to the techniques described with reference to FIGS. 2 through 10. In certain examples, aspects of the operation(s) of block 1810 may be performed using an information bit location identifier, as described with reference to FIGS. 12 and 13, or an nulled repetition operation determiner, as described with reference to FIG. 13.

At blocks 1815 and 1820, the wireless device may determine, based at least in part on the respective numbers of the nulled repetition operations per polarization stage, the polarization weights per polarized bit-channel of the polar code decoder.

At block 1815, the wireless device may identify, for each polarization stage having one or more nulled repetition operations, a polarization weight factor based at least in part on a total number of repetition operations for the each polarization stage (e.g., a number of the active repetition operations plus the nulled repetition operations) and a respective number of the nulled repetition operations for the each polarization stage. In some examples, the polarization weight factor for a polarization stage may be based at least in part on a ratio of active repetition operations in the polarization stage to the total number of repetition operations in the polarization stage. The operation(s) of block 1815 may be performed according to the techniques described with reference to FIGS. 2 through 10. In certain examples, aspects of the operation(s) of block 1815 may be performed using an information bit location identifier, as described with reference to FIGS. 12 and 13, or a polarization weight determiner, as described with reference to FIG. 13.

At block 1820, the wireless device may generate a polarization weight for each of the polarized bit-channels by combining a set of polarization stage weights associated with each active repetition operation of the each of the polarized bit-channels. Each polarization stage weight of the set of polarization stage weights may be based at least in part on the polarization weight factor for a corresponding polarization stage. In some examples, the set of polarization stage weights may be determined by the polarization stage weight associated with the each active repetition operation scaled by the polarization weight factor for the corresponding polarization stage of the each active repetition operation. The operation(s) of block 1820 may be performed according to the techniques described with reference to FIGS. 2 through 10. In certain examples, aspects of the operation(s) of block 1820 may be performed using an information bit location identifier, as described with reference to FIGS. 12 and 13, or a polarization weight determiner, as described with reference to FIG. 13.

At block 1825, the wireless device may determine the set of information bit locations based at least in part on a ranking of the polarization weights per polarized bit-channel of the polar code decoder. The operation(s) of block 1825 may be performed according to the techniques described with reference to FIGS. 2 through 10. In certain examples, aspects of the operation(s) of block 1825 may be performed using an information bit location identifier, as described with reference to FIGS. 12 and 13.

At block 1830, the wireless device may process the received codeword using the polar code decoder to obtain an information bit vector at the set of information bit locations. In some examples, the polar code decoder may be a natural bit order polar decoder or a bit-reversed order polar code decoder. The operation(s) of block 1830 may be performed according to the techniques described with reference to FIGS. 2 through 10. In certain examples, aspects of the operation(s) of block 1830 may be performed using a polar code decoder, as described with reference to FIGS. 12 and 13.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communication systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A time division multiple access (TDMA) system may implement a radio technology such as Global System for Mobile Communications (GSM).

An orthogonal frequency division multiple access (OFDMA) system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunication system (UMTS). 3GPP Long Term Evolution (LTE) and LTE-Advanced (LTE-A) are releases of Universal Mobile Telecommunication system (UMTS) that use E-UTRA. UTRA, E-UTRA, UMTS, LTE, LTE-A, NR, and Global System for Mobile communications (GSM) are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communication system or systems described herein may include a heterogeneous LTE/LTE-A or NR network in which different types of eNBs provide coverage for various geographical regions. For example, each eNB, gNB or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), next generation NodeB (gNB), Home NodeB, a Home eNodeB, or some other suitable terminology. The geographic coverage area for a base station may be divided into sectors making up only a portion of the coverage area. The wireless communication system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communication system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communication system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method of wireless communication, comprising:
   identifying a set of punctured bit locations in a received codeword, the received codeword being encoded using a polar code;
   identifying a set of information bit locations of the polar code, wherein the set of information bit locations is determined based at least in part on polarization weights per polarized bit-channel of a polar code decoder that are a function of nulled repetition operations per polarization stage of the polar code identified based at least in part on the set of punctured bit locations; and processing the received codeword using the polar code decoder to obtain an information bit vector at the set of information bit locations.

2. The method of claim 1, wherein the identifying the set of information bit locations comprises:

determining, based at least in part on the set of punctured bit locations, respective numbers of the nulled repetition operations per polarization stage of the polar code;

determining, based at least in part on the respective numbers of the nulled repetition operations per polarization stage, the polarization weights per polarized bit-channel of the polar code decoder; and determining the set of information bit locations based at least in part on a ranking of the polarization weights per polarized bit-channel of the polar code decoder.

3. The method of claim 2, wherein the determining the polarization weights per polarized bit-channel comprises:

identifying, for each polarization stage having one or more nulled repetition operations, a polarization weight factor based at least in part on a total number of repetition operations for the each polarization stage and a respective number of the nulled repetition operations for the each polarization stage; and generating a polarization weight for each polarized bit-channel of the polarized bit-channels by combining a set of polarization stage weights associated with each active repetition operation of the each polarized bit-channel of the polarized bit-channels, wherein each polarization stage weight of the set of polarization stage weights is based at least in part on the polarization weight factor for a corresponding polarization stage.

4. The method of claim 3, wherein the polarization weight factor for a polarization stage is based at least in part on a ratio of active repetition operations in the polarization stage to the total number of repetition operations in the polarization stage.

5. The method of claim 3, wherein the set of polarization stage weights is determined by the polarization stage weight associated with the each active repetition operation scaled by the polarization weight factor for the corresponding polarization stage of the each active repetition operation.

6. The method of claim 1, wherein the polar code decoder is a natural bit order polar code decoder or a bit-reversed order polar code decoder.

7. An apparatus for wireless communication, comprising:

means for identifying a set of punctured bit locations in a received codeword, the received codeword being encoded using a polar code;

means for identifying a set of information bit locations of the polar code, wherein the set of information bit locations is determined based at least in part on polarization weights per polarized bit-channel of a polar code decoder that are a function of nulled repetition operations per polarization stage of the polar code identified based at least in part on the set of punctured bit locations; and means for processing the received codeword using the polar code decoder to obtain an information bit vector at the set of information bit locations.

8. The apparatus of claim 7, wherein the means for identifying the set of information bit locations comprises:

means for determining, based at least in part on the set of punctured bit locations, respective numbers of the nulled repetition operations per polarization stage of the polar code;

means for determining, based at least in part on the respective numbers of the nulled repetition operations per polarization stage, the polarization weights per polarized bit-channel of the polar code decoder; and means for determining the set of information bit locations based at least in part on a ranking of the polarization weights per polarized bit-channel of the polar code decoder.

9. The apparatus of claim 8, wherein the means for determining the polarization weights per polarized bit-channel comprises:

means for identifying, for each polarization stage having one or more nulled repetition operations, a polarization weight factor based at least in part on a total number of repetition operations for the each polarization stage and a respective number of the nulled repetition operations for the each polarization stage; and means for generating a polarization weight for each polarized bit-channel of the polarized bit-channels by combining a set of polarization stage weights associated with each active repetition operation of the each polarized bit-channel of the polarized bit-channels, wherein each polarization stage weight of the set of polarization stage weights is based at least in part on the polarization weight factor for a corresponding polarization stage.

10. The apparatus of claim 9, wherein the polarization weight factor for a polarization stage is based at least in part on a ratio of active repetition operations in the polarization stage to the total number of repetition operations in the polarization stage.

11. The apparatus of claim 9, wherein the set of polarization stage weights is determined by the polarization stage weight associated with the each active repetition operation scaled by the polarization weight factor for the corresponding polarization stage of the each active repetition operation.

12. The apparatus of claim 7, wherein the polar code decoder is a natural bit order polar code decoder or a bit-reversed order polar code decoder.

13. An apparatus for wireless communication, comprising:

a processor;

memory in electronic communication with the processor; and instructions stored in the memory, the instructions being executable by the processor to:

identify a set of punctured bit locations in a received codeword, the received codeword being encoded using a polar code;

identify a set of information bit locations of the polar code, wherein the set of information bit locations is determined based at least in part on polarization weights per polarized bit-channel of a polar code decoder that are a function of nulled repetition operations per polarization stage of the polar code identified based at least in part on the set of punctured bit locations; and process the received codeword using the polar code decoder to obtain an information bit vector at the set of information bit locations.

14. The apparatus of claim 13, wherein the instructions executable by the processor to identify the set of information bit locations comprise instructions executable by the processor to:
  determine, based at least in part on the set of punctured bit locations, respective numbers of the nulled repetition operations per polarization stage of the polar code;
  determine, based at least in part on the respective numbers of the nulled repetition operations per polarization stage, the polarization weights per polarized bit-channel of the polar code decoder; and
  determine the set of information bit locations based at least in part on a ranking of the polarization weights per polarized bit-channel of the polar code decoder.

15. The apparatus of claim 14, wherein the instructions executable by the processor to determine the polarization weights per polarized bit-channel comprise instructions executable by the processor to:
  identify, for each polarization stage having one or more nulled repetition operations, a polarization weight factor based at least in part on a total number of repetition operations for the each polarization stage and a respective number of the nulled repetition operations for the each polarization stage; and
  generate a polarization weight for each polarized bit-channel of the polarized bit-channels by combining a set of polarization stage weights associated with each active repetition operation of the each polarized bit-channel of the polarized bit-channels, wherein each polarization stage weight of the set of polarization stage weights is based at least in part on the polarization weight factor for a corresponding polarization stage.

16. The apparatus of claim 15, wherein the polarization weight factor for a polarization stage is based at least in part on a ratio of active repetition operations in the polarization stage to the total number of repetition operations in the polarization stage.

17. The apparatus of claim 15, wherein the set of polarization stage weights is determined by the polarization stage weight associated with the each active repetition operation scaled by the polarization weight factor for the corresponding polarization stage of the each active repetition operation.

18. The apparatus of claim 13, wherein the polar code decoder is a natural bit order polar code decoder or a bit-reversed order polar code decoder.

19. A non-transitory computer-readable medium storing computer-executable code for wireless communication, the code executable by a processor to:
  identify a set of punctured bit locations in a received codeword, the received codeword being encoded using a polar code;
  identify a set of information bit locations of the polar code, wherein the set of information bit locations is determined based at least in part on polarization weights per polarized bit-channel of a polar code decoder that are a function of nulled repetition operations per polarization stage of the polar code identified based at least in part on the set of punctured bit locations; and
  process the received codeword using the polar code decoder to obtain an information bit vector at the set of information bit locations.

20. The non-transitory computer-readable medium of claim 19, wherein the code executable by the processor to identify the set of information bit locations comprises code executable by the processor to:
  determine, based at least in part on the set of punctured bit locations, respective numbers of the nulled repetition operations per polarization stage of the polar code;
  determine, based at least in part on the respective numbers of the nulled repetition operations per polarization stage, the polarization weights per polarized bit-channel of the polar code decoder; and
  determine the set of information bit locations based at least in part on a ranking of the polarization weights per polarized bit-channel of the polar code decoder.

21. The non-transitory computer-readable medium of claim 20, wherein the code executable by the processor to determine the polarization weights per polarized bit-channel comprises code executable by the processor to:
  identify, for each polarization stage having one or more nulled repetition operations, a polarization weight factor based at least in part on a total number of repetition operations for the each polarization stage and a respective number of the nulled repetition operations for the each polarization stage; and
  generate a polarization weight for each polarized bit-channel of the polarized bit-channels by combining a set of polarization stage weights associated with each active repetition operation of the each polarized bit-channel of the polarized bit-channels, wherein each polarization stage weight of the set of polarization stage weights is based at least in part on the polarization weight factor for a corresponding polarization stage.

22. The non-transitory computer-readable medium of claim 21, wherein the polarization weight factor for a polarization stage is based at least in part on a ratio of active repetition operations in the polarization stage to the total number of repetition operations in the polarization stage.

23. The non-transitory computer-readable medium of claim 21, wherein the set of polarization stage weights is determined by the polarization stage weight associated with the each active repetition operation scaled by the polarization weight factor for the corresponding polarization stage of the each active repetition operation.

24. The non-transitory computer-readable medium of claim 19, wherein the polar code decoder is a natural bit order polar code decoder or a bit-reversed order polar code decoder.

* * * * *